(12) United States Patent
Lin et al.

(10) Patent No.: US 12,009,216 B2
(45) Date of Patent: Jun. 11, 2024

(54) METHODS OF FORMING SILICIDE CONTACT IN FIELD-EFFECT TRANSISTORS

(71) Applicant: Taiwan Semiconductor Manufacturing Co., Ltd., Hsin-Chu (TW)

(72) Inventors: Chun-Hsiung Lin, Hsinchu County (TW); Shih-Cheng Chen, New Taipei (TW); Chih-Hao Wang, Hsinchu (TW); Jung-Hung Chang, Changhua County (TW); Jui-Chien Huang, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 18/358,152

(22) Filed: Jul. 25, 2023

(65) Prior Publication Data

US 2023/0369054 A1 Nov. 16, 2023

Related U.S. Application Data

(60) Continuation of application No. 17/722,582, filed on Apr. 18, 2022, now Pat. No. 11,764,065, which is a (Continued)

(51) Int. Cl.
*H01L 21/285* (2006.01)
*H01L 21/02* (2006.01)
*H01L 21/311* (2006.01)
*H01L 29/06* (2006.01)
*H01L 29/423* (2006.01)
(Continued)

(52) U.S. Cl.
CPC .. *H01L 21/28518* (2013.01); *H01L 21/02236* (2013.01); *H01L 21/02532* (2013.01); *H01L 21/02603* (2013.01); *H01L 21/31111* (2013.01); *H01L 29/0673* (2013.01); *H01L 29/42392* (2013.01); *H01L 29/45* (2013.01); *H01L 29/66545* (2013.01); *H01L 29/66742* (2013.01); *H01L 29/78618* (2013.01); *H01L 29/78696* (2013.01)

(58) Field of Classification Search
CPC ......... H01L 21/28518; H01L 21/02236; H01L 21/02532; H01L 21/02603; H01L 29/0673; H01L 29/42392; H01L 29/66545; H01L 29/66742; H01L 29/78618; H01L 29/78696; H01L 29/0653; H01L 29/0847; H01L 29/66439; H01L 29/66477; H01L 29/7855
See application file for complete search history.

(56) References Cited

U.S. PATENT DOCUMENTS 8,722,109 B1 7/2014 Colinge
8,785,285 B2 7/2014 Tsai et al.
(Continued)

*Primary Examiner* — Marc Anthony Armand
(74) *Attorney, Agent, or Firm* — Haynes and Boone, LLP

(57) ABSTRACT

A semiconductor structure includes a semiconductor fin extending from a substrate, a source/drain (S/D) feature disposed over the semiconductor fin, a silicide layer disposed over the S/D feature, where the silicide layer extends along a sidewall of the S/D feature, and an etch-stop layer (ESL) disposed along a sidewall of the silicide layer.

20 Claims, 28 Drawing Sheets

Related U.S. Application Data continuation of application No. 17/102,213, filed on Nov. 23, 2020, now Pat. No. 11,309,187, which is a division of application No. 16/444,735, filed on Jun. 18, 2019, now Pat. No. 10,847,373.

(60) Provisional application No. 62/749,448, filed on Oct. 23, 2018.

(51) Int. Cl.
*H01L 29/45* (2006.01)
*H01L 29/66* (2006.01)
*H01L 29/786* (2006.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2017/0221890 A1* | 8/2017 | Wang ............... H01L 21/823481 |
| 2020/0135932 A1* | 4/2020 | Wang ................ H01L 29/41733 |

* cited by examiner

METHODS OF FORMING SILICIDE CONTACT IN FIELD-EFFECT TRANSISTORS

CROSS-REFERENCE TO RELATED APPLICATIONS

This is a continuation application of U.S. application Ser. No. 17/722,582, filed on Apr. 18, 2022, which is continuation application of U.S. application Ser. No. 17/102,213, filed on Nov. 23, 2020, which is a divisional application of U.S. application Ser. No. 16/444,735, filed on Jun. 18, 2019, now U.S. patent application Ser. No. 10,847,373, which claims priority to U.S. Provisional Patent Application Ser. No. 62/749,448, filed on Oct. 23, 2018, the entire disclosures of which are incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, reducing contact resistance between source/drain features and source/drain contacts becomes more challenging when device sizes continue to decrease. Although methods for addressing such challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
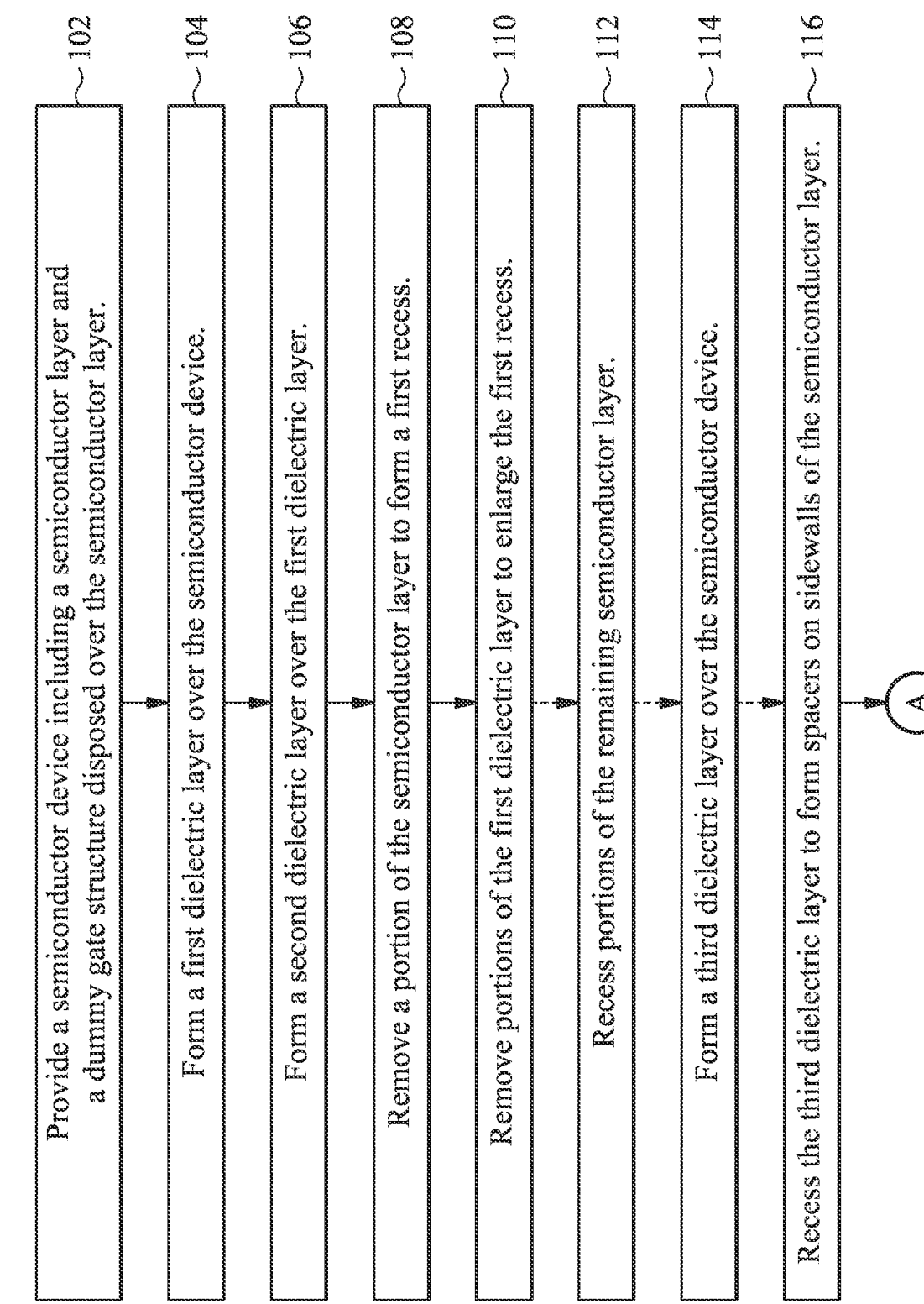
FIGS. 1A and 1B illustrate a flowchart of an example method for making a semiconductor device in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed. The present disclosure is generally related to semiconductor devices and the fabrication thereof, and more particularly to methods of fabricating field-effect transistors (FETs), such as fin-like FETs (FinFETs), gate-all-around FETs (GAA FETs), and/or other FETs.

Embodiments such as those described herein provide methods of forming silicide contact (hereafter referred to as a silicide layer) over an epitaxial source/drain (S/D) feature in FETs. In particular, the present disclosure provides methods of forming a silicide layer that wraps around the epitaxial S/D feature to reduce contact resistance between the epitaxial S/D feature and a subsequently formed S/D contact thereover. Generally, a silicide layer is formed over a top surface of an epitaxial S/D feature after a contact trench (or a contact hole) is formed over the epitaxial S/D feature. As a result, a surface area of the silicide layer may be restricted to only a top portion of the epitaxial S/D feature, thereby limiting a contact area between the silicide layer and the S/D contact. In addition, limitation on the surface area of the silicide layer may also arise from non-uniform sizes of the epitaxial S/D features. For example, other factors being constant, a processing window for forming a silicide layer over a larger epitaxial S/D feature may be more restricted when compared to a silicide formed over a smaller epitaxial S/D feature. Therefore, for at least these reasons, improvements in methods of forming silicide layers and controlling uniformity of epitaxial S/D features are desired.

Figure 1B:
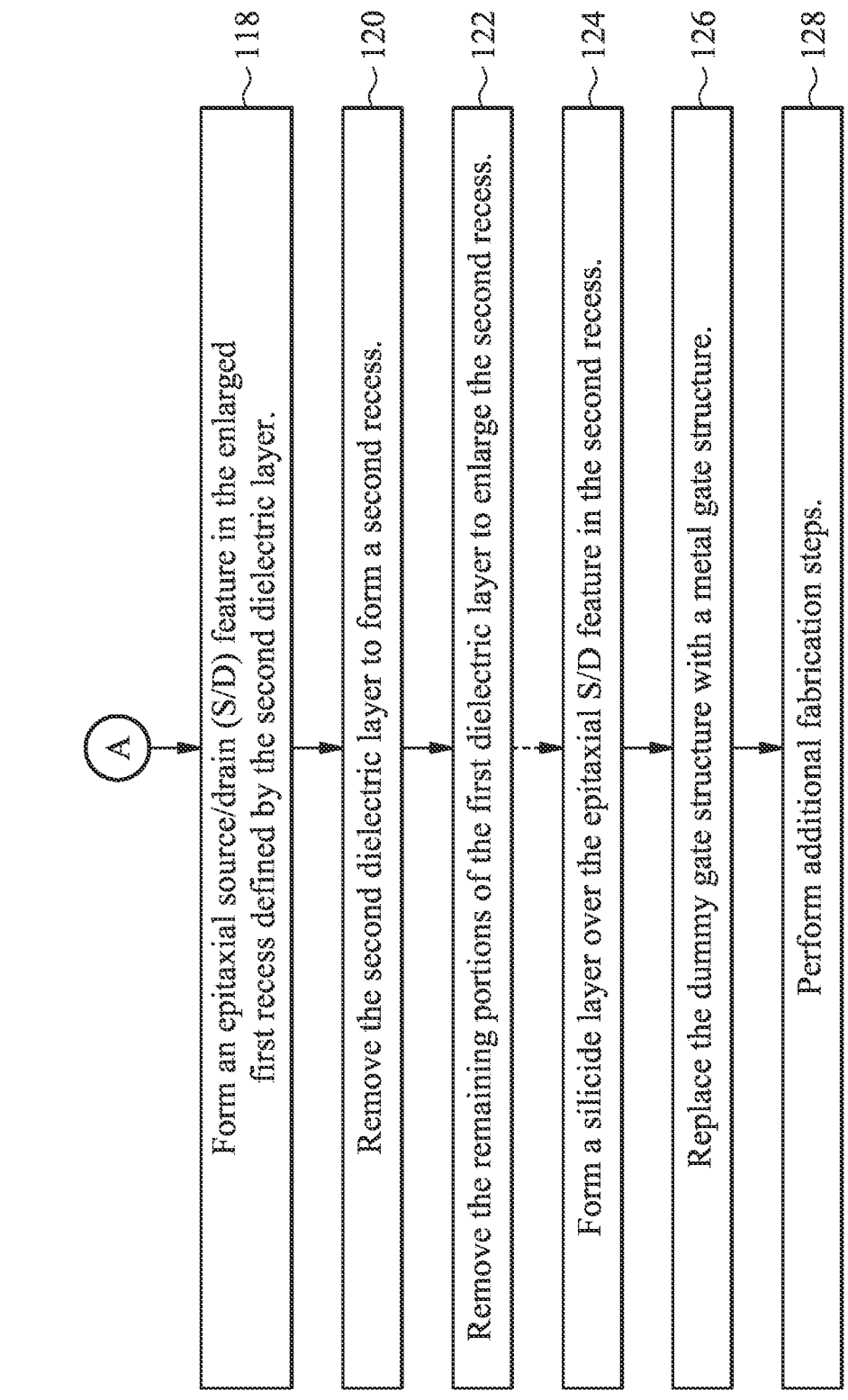

FIGS. 1A and 1B illustrates a flow chart of a method 100 for forming a semiconductor device (hereafter referred to as "device") 200 in accordance with some embodiments of the present disclosure. The method 100 is merely an example and is not intended to limit the present disclosure beyond what is explicitly recited in the claims. Additional operations can be performed before, during, and after the method 100, and some operations described can be replaced, eliminated, or moved around for additional embodiments of the method. The method 100 is described below in conjunction with FIGS. 3A-14, which illustrate various three-dimensional and cross-sectional views of the device 200 during intermediate steps of the method 100. In particular, FIG. 2A illustrates a three-dimensional view of the device 200, FIG. 2B illustrates a planar top view of the device 200, while FIGS. 3A, 4A, 5A, 6A, 7A, 8A, 9A, 10A, 11A, 12A, 13A, and 14A illustrate cross-sectional views of the device 200 taken along line AA' as shown in FIG. 2A, and FIGS. FIGS. 3B, 4B, 5B, 6B, 7B, 8B, 9B, 10B, 11B, 12B, 13B, and 14B illustrate cross-sectional views of the device 200 taken along line BB' as shown in FIG. 2A.

The device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells The present disclosure is not limited to any particular number of devices or device regions, or to any particular device configurations. For example, though the device 200 as illustrated is a three-dimensional FET device (e.g., a FinFET or a GAA FET), the present disclosure may also provide embodiments for fabricating planar FET devices.

Figure 2A:
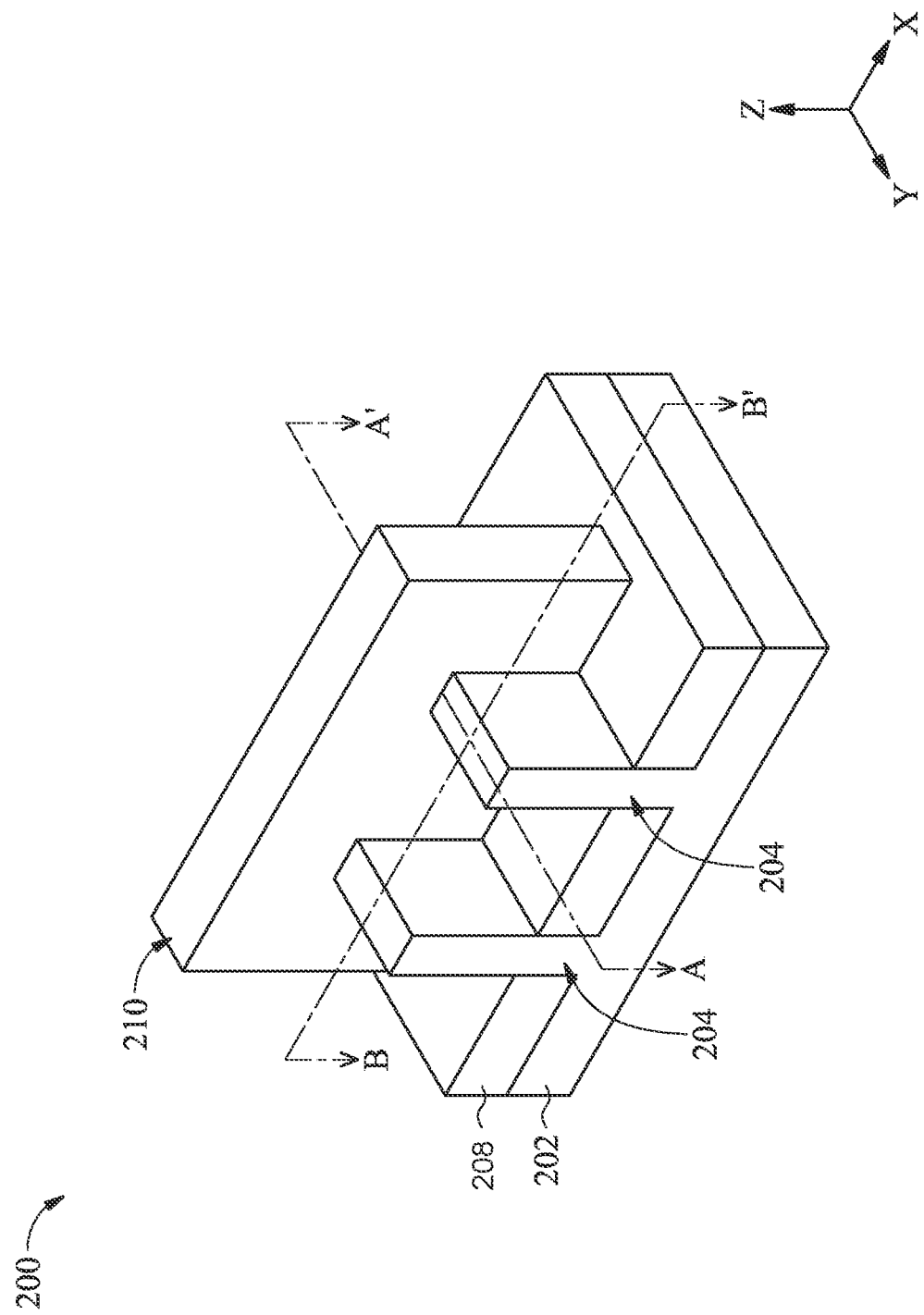
FIG. 2A illustrates a three-dimensional perspective view of an example semiconductor device in accordance with some embodiments of the present disclosure.
Figure 2B:
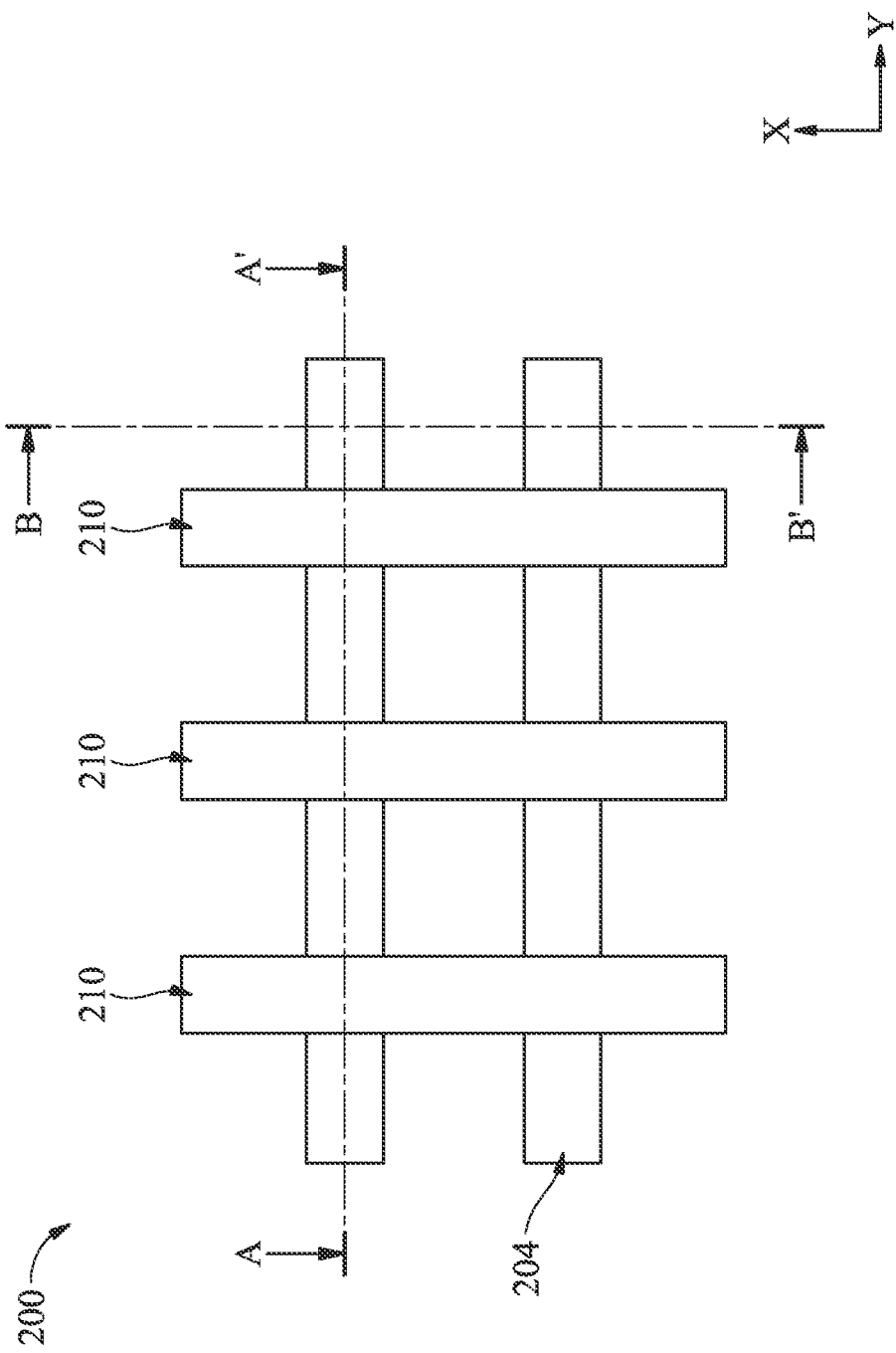
FIG. 2B illustrates a planar top view of an example semiconductor device in accordance with some embodiments of the present disclosure.

Referring to FIGS. 1 and 2A-2B, the method 100 at operation 102 provides the device 200 that includes one or more semiconductor fins 204 protruding from a substrate 202 and separated by isolation structures 208 and a dummy gate stack 210 disposed over the substrate 202. The device 200 may include other components, such as gate spacers (not included) disposed on sidewalls of the dummy gate stack 210, various hard mask layers disposed over the dummy gate stack 210 (discussed in detail below), barrier layers, other suitable layers, or combinations thereof.

The substrate 202 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions, such as source/drain regions, are disposed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Each semiconductor fin 204 may be suitable for providing an n-type FET or a p-type FET. In some embodiments, the semiconductor fins 204 as illustrated herein may be suitable for providing FinFETs of a similar type, i.e., both n-type or both p-type. Alternatively, they may be suitable for providing FinFETs of opposite types, i.e., an n-type and a p-type. This configuration is for illustrative purposes only and is not intended to be limiting. The semiconductor fins 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the semiconductor fins 204 on the substrate 202. The etching process may include dry etching, wet etching, reactive ion etching (RIE), and/or other suitable processes.

Numerous other embodiments of methods for forming the semiconductor fins 204 may be suitable. For example, the semiconductor fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3A:
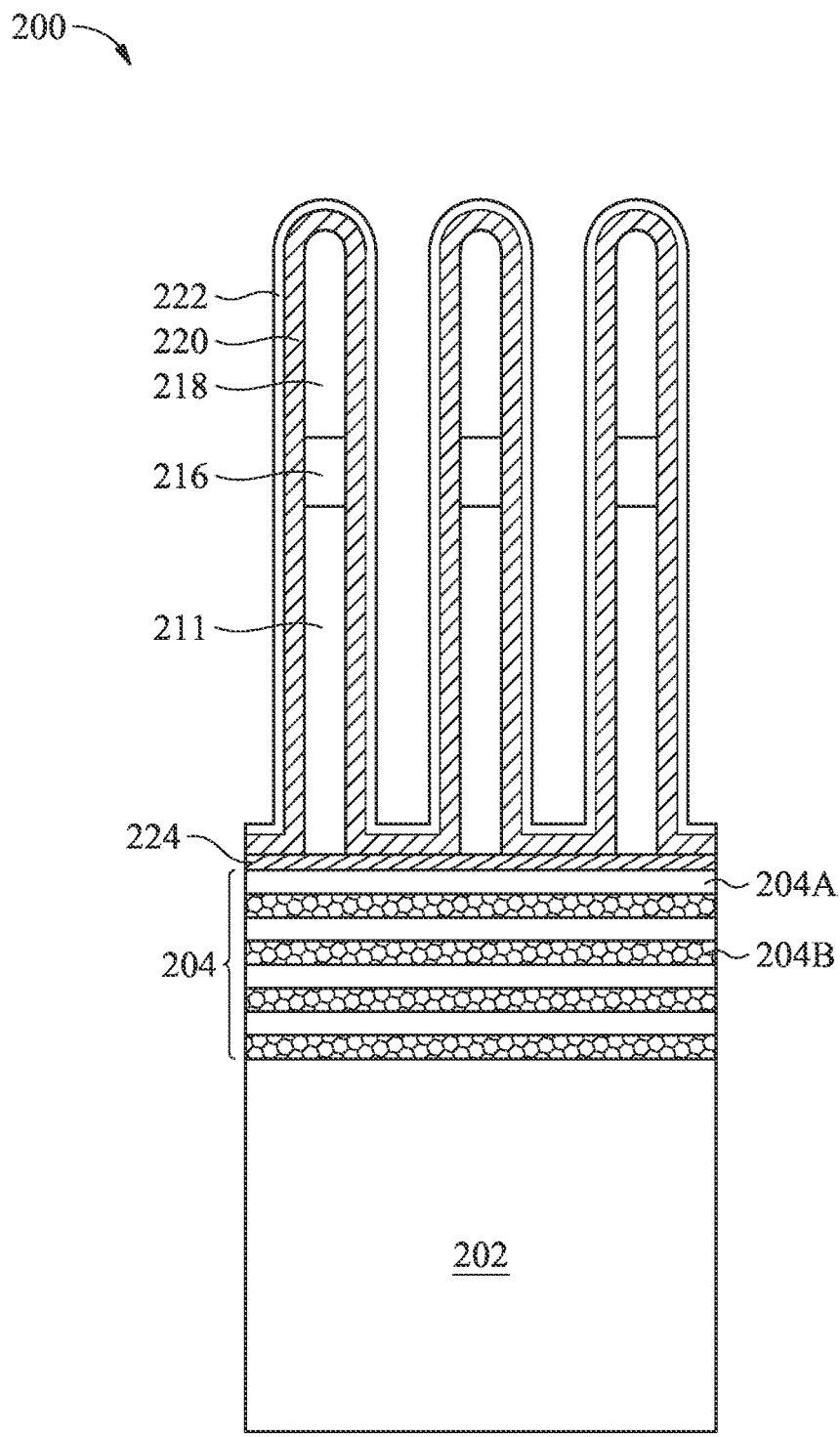
FIGS. 3A, 4A, 5A, 6A, 7A, 8A, 9A, 10A, 11A, 12A, 13A, and 14A illustrate cross-sectional views of the semiconductor device of FIGS. 2A and 2B taken along line AA' at intermediate stages of an embodiment of the method of FIGS. 1A and 1B in accordance with some embodiments of the present disclosure.

In the depicted embodiments, referring to FIG. 3A for example, the semiconductor fin 204 may include alternating layers of semiconductor materials, e.g., semiconductor material 204A and semiconductor material 204B that is different from the semiconductor material 204A. In some example embodiments, the semiconductor fin 204 may include a total of three to ten alternating layers of semiconductor materials; of course, the present disclosure is not limited to such configuration. In the present disclosure, the semiconductor material 204A includes Si, while the semiconductor material 204B includes SiGe. Either or both of the semiconductor materials 204A and 204B may be doped with a suitable dopant, such as a p-type dopant or an n-type dopant, for forming desired FETs. The semiconductor materials 204A and 204B may each be formed by an epitaxial process, such as, for example, a molecular beam epitaxy (MBE) process, a CVD process such as a metal organic CVD (MOCVD) process, and/or other suitable epitaxial growth processes.

In many embodiments, alternating layers of the semiconductor materials 204A and 204B are configured to provide multi-gate devices such as GAA FETs, the details of forming which are provided below. Multi-gate devices have been introduced in an effort to improve gate control by increasing gate-channel coupling, reduce OFF-state current, and reduce short-channel effects (SCEs). A multi-gate device such as a GAA FET generally includes a gate structure that extends around its horizontal channel region, providing access to the channel region on all sides. The GAA FETs are generally compatible with CMOS processes, allowing them to be aggressively scaled down while maintaining gate control and mitigating SCEs. Of course, the present disclosure is not limited to forming GAA FETs only and may provide other three-dimensional FETs such as FinFETs. As such, the semiconductor fin 204 may include a single layer of semiconductor material or multiple layers of different semiconductor materials not configured in an alternating stack, such that a uniform fin is provided to form a FinFET.

The isolation structures 208 may include silicon oxide, silicon nitride, silicon oxynitride, fluorine-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the semiconductor fins 204. The trenches may then be filled with an isolating material described above by a deposition process, followed by a chemical mechanical planarization (CMP) process. Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as chemical vapor deposition (CVD), flowable CVD (FCVD), spin-on-glass (SOG), other suitable methods, or combinations thereof. The isolation structures 208 may be formed by depositing a dielectric layer as a spacer layer over the semiconductor fins 204 and subsequently recessing the dielectric layer such that a top surface of the isolation structures 208 is below a top surface of the semiconductor fins 204.

Figure 3B:
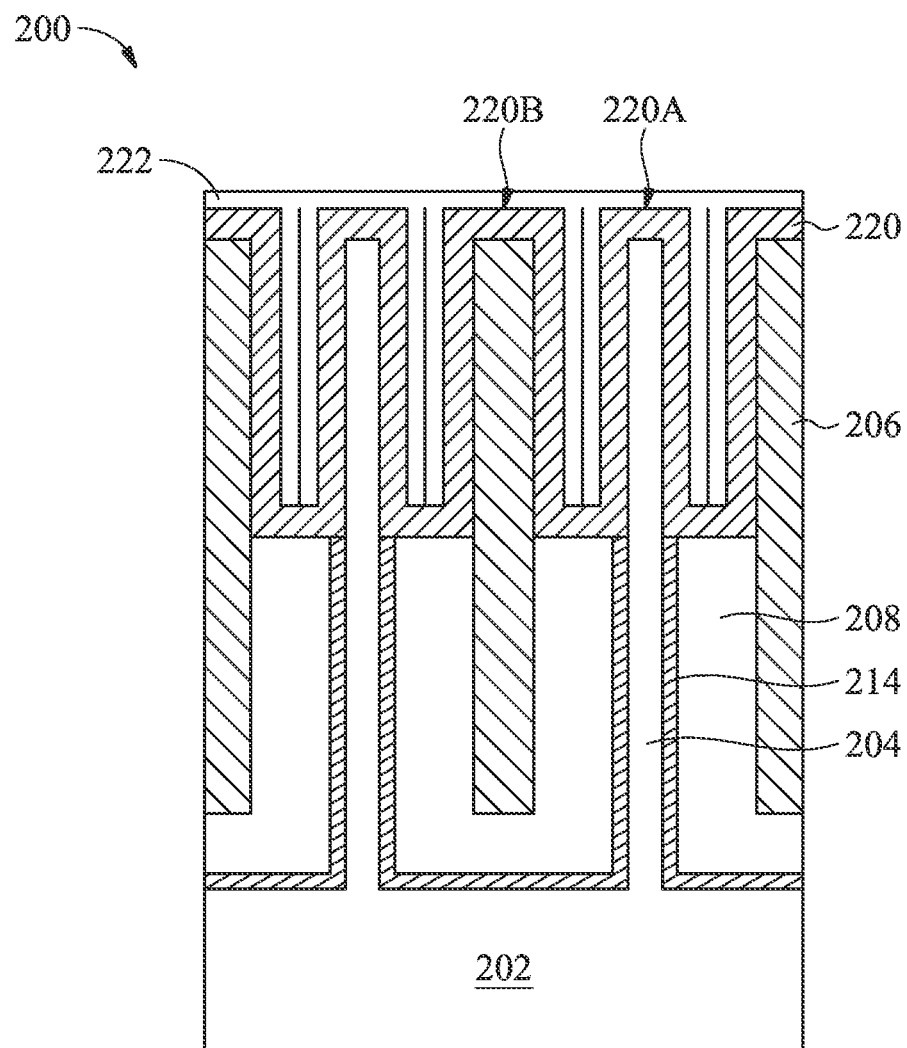
FIGS. 3B, 4B, 5B, 6B, 7B, 8B, 9B, 10B, 11B, 12B, 13B, and 14B illustrate cross-sectional views of the semiconductor device of FIGS. 2A and 2B taken along line BB' at intermediate stages of an embodiment of the method of FIGS. 1A and 1B in accordance with some embodiments of the present disclosure.

In some embodiments, as depicted in FIGS. 3A and 3B, a fin spacer layer 214 is formed on the sidewalls of the semiconductor fins 204. The fin spacer layer 214 may include any suitable dielectric material, such as silicon nitride, silicon oxide, silicon oxynitride, other suitable dielectric materials, or combinations thereof. In some embodiments, the fin spacer layer 214 includes a dielectric material different from that of the isolation structures 208 and the dielectric fins 206. The fin spacer layer 214 may be first deposited conformally over the semiconductor fins 204. The dielectric layer for forming the isolation structures 208 is then deposited over the fin spacer layer 214, thereby filling in the space in the fin spacer layer 214. Thereafter, the dielectric layer for forming the isolation structures 208 is recessed as discussed above to form the semiconductor fins 204 with the fins spacers layer 214 remaining on the sidewalls of the semiconductor fins 204.

In some embodiments, the device 200 includes dielectric fins 206 disposed over the substrate 202. Referring to FIG. 3B, for example, each dielectric fin 206 may be disposed between the semiconductor fins 204 and oriented substantially parallel to the semiconductor fins 204. However, unlike the semiconductor fins 204 configured to provide active devices, the dielectric fins 206 are inactive and not configured to form FETs. In some embodiments, the dielectric fins 206 are provided to adjust fin-to-fin spacing (i.e., fin pitch) such that the thicknesses of the subsequently formed dielectric layers (e.g., dielectric layers 220 and 222) may be controlled according to design requirements. The dielectric fins 206 may be formed by any suitable method. In one example, as discussed above, the isolation structures 208 may first be deposited as a spacer layer over sidewalls of the semiconductor fins 204. Before recessing the isolation structures 208 to be lower than the semiconductor fins 204, a dielectric layer for forming the dielectric fins 206 is deposited over sidewalls of the isolation structures 208. Thereafter, the isolation structures 208 are recessed (e.g., by a chemical etching process) such that its top surface is lower than both the top surface of the semiconductor fins 204 and a top surface of the dielectric layer for forming the dielectric fins 206.

In many embodiments, the dummy gate stack 210 is provided as a placeholder for subsequently forming a high-k metal gate structure (HKMG; where "high-k" refers to a dielectric constant greater than that of silicon oxide, which is about 3.9) and may include a dummy gate electrode 211 and various other material layers. In some embodiments, the dummy gate electrode 211 includes polysilicon. In the depicted embodiments, referring to FIG. 3A, the dummy gate stack may include an interfacial layer 224 disposed between the semiconductor fins 204 and the dummy gate electrode 211, a dummy gate dielectric layer (not depicted), disposed over the interfacial layer 224, a hard mask layer 216 disposed over the dummy gate electrode 211, and/or a hard mask layer 218 disposed over the hard mask layer 216. As will be discussed in detail below, portions of the dummy gate stack 210 are replaced with the HKMG during a gate replacement process after other components (e.g., the epitaxial S/D features 250) of the device 200 are fabricated. The hard mask layers 216 and 218 may each include any suitable dielectric material, such as a semiconductor oxide and/or a semiconductor nitride. In one example, the hard mask layer 216 includes silicon carbonitride, and the hard mask layer 218 includes silicon oxide. The interfacial layer 224 may include any suitable material, such as silicon oxide. Various material layers of the dummy gate stack 210 may be formed by any suitable process, such as CVD, PVD, ALD, chemical oxidation, other suitable processes, or combinations thereof.

Now referring to FIGS. 1A, 3A, and 3B, the method 100 at operation 104 forms a dielectric layer 220 over the device 200. In many embodiments, the dielectric layer 220 is formed conformally over the device 200, including the semiconductor fins 204, the dielectric fins 206, and the dummy gate stacks 210. The dielectric layer 220 may include any suitable dielectric material, such as a nitrogen-containing dielectric material, and may be formed by any suitable method, such as ALD, CVD, PVD, other suitable methods, or combinations thereof. In the depicted embodiment, the dielectric layer 220 is formed by a thermal ALD process. In some examples, the dielectric layer 220 may include silicon nitride, silicon carbonitride, silicon oxycarbonitride, other suitable dielectric materials, or combinations thereof. In the depicted embodiment, the dielectric layer 220 includes two portions: portion 220A that is deposited on sidewalls of the semiconductor fins 204 and portion 220B that is deposited on sidewalls of the dielectric fins 206. In furtherance to the embodiment, the portions 220A and 220B are separated by a subsequently formed dielectric layer 222 (discussed below).

Still referring to FIGS. 1A, 3A, and 3B, the method 100 at operation 106 forms a dielectric layer 222 over the dielectric layer 220. Similar to the dielectric layer 220, the dielectric layer 222 is formed conformally over the dummy gate stacks 210. Notably, because the presence of the dielectric fins 206 reduces the fin-to-fin spacing as depicted in FIG. 3B, the dielectric layer 222 may fill any gap formed over the dielectric layer 220. The dielectric layer 222 may include any suitable dielectric material, such as an oxygen-containing dielectric material or a high-k dielectric material, and may be formed by any suitable method, such as ALD, CVD, PVD, other suitable methods, or combinations thereof. In the depicted embodiment, the dielectric layer 220 is formed by a thermal ALD process. In some examples, the dielectric layer 222 may include silicon oxide, silicon oxycarbide, a high-k dielectric material (e.g., hafnium oxide, zirconium oxide, lanthanum oxide, yttrium oxide, etc.), other suitable dielectric materials, or combinations thereof. Notably, though not limited to any specific values, thicknesses of the dielectric layers 220 and 222 may be determined by the fin-to-fin spacing between the semiconductor fins 204 and the dielectric fins 206. For example, each of the dielectric layers 220 and 222 may formed to a thickness of less than about 10 nm. Furthermore, in the present disclosure, the dielectric layers 220 and 222 include different compositions, such that an etching selectivity exists between the two material layers when both are subjected to a common etchant.

Figure 4A:
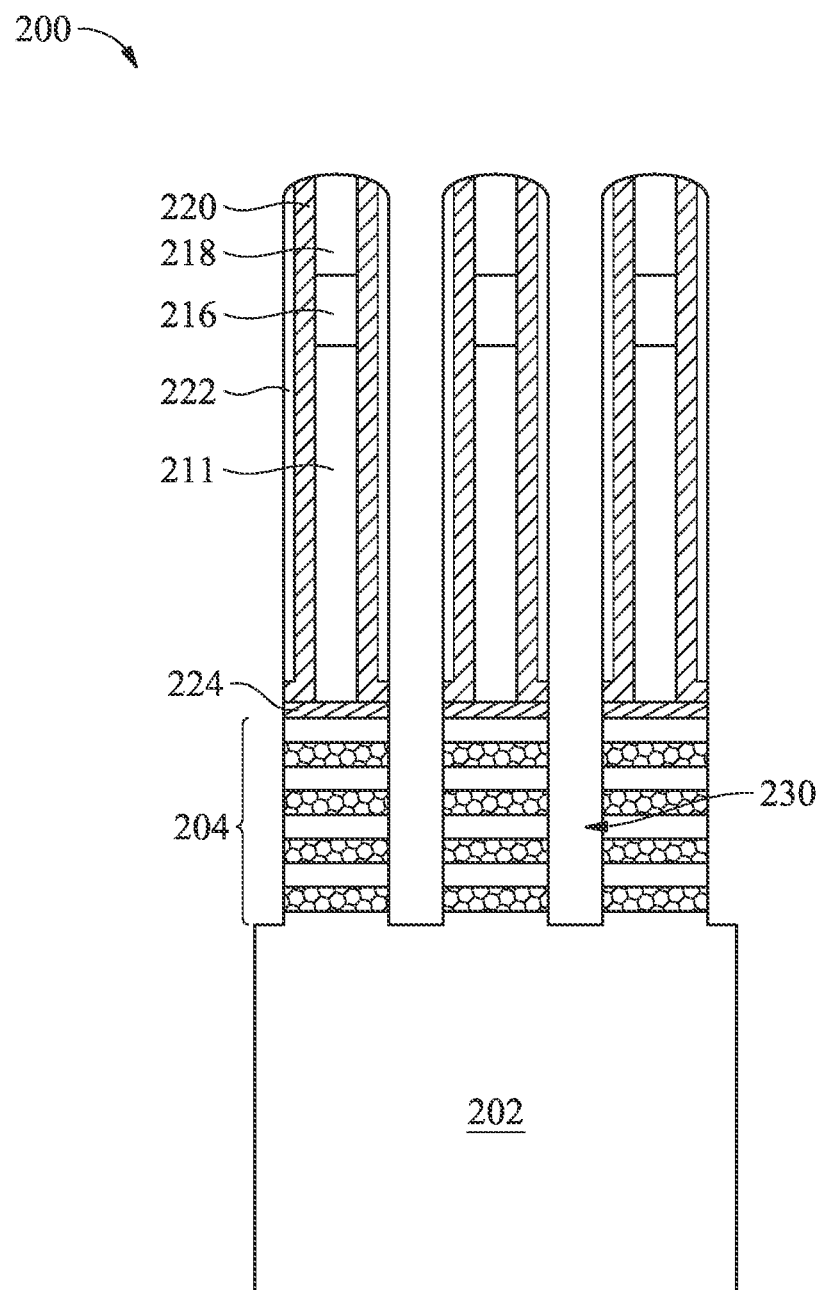
Figure 4B:
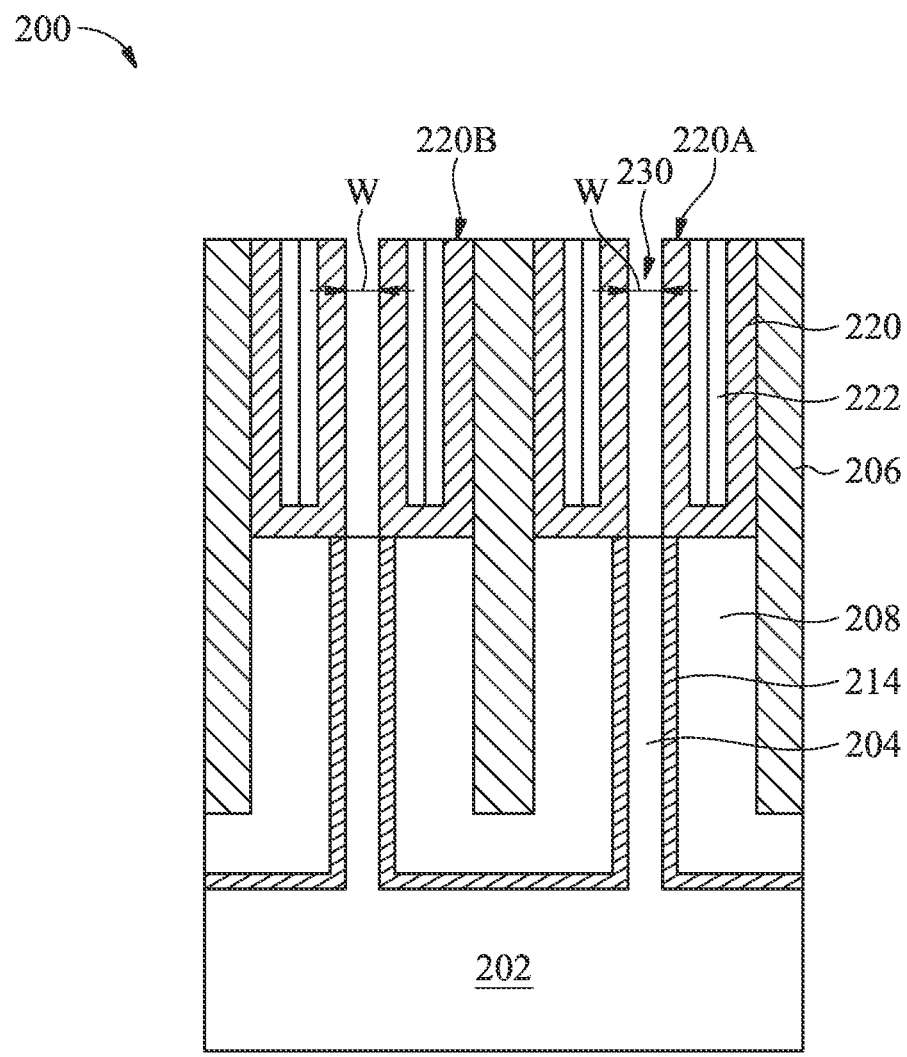

Now referring to FIGS. 1A, 4A, and 4B, the method 100 at operation 108 removes a portion of the semiconductor fins 204 to form a recess 230. In many embodiments, the method 100 forms the recess 230 by a suitable etching process, such as a dry etching process, a wet etching process, or an RIE process. In some embodiments, the method 100 selectively removes the semiconductor fins 204 without etching or substantially etching portions of the dielectric layers 220 and 222 formed on sidewalls of the semiconductor fins 204 and the dielectric fins 206. As depicted herein, portions of the dielectric layers 220 and 222 as well as the hard mask layer 218 formed over the dummy gate electrode and the dielectric fins 206 may be removed at operation 108 to form the recess 230. The etching process at operation 108 may implement a dry etching process using an etchant including a bromine-containing gas (e.g., HBr and/or $CHBr_3$), a fluorine-containing gas (e.g., $CF_4$, $SF_6$, $CH_2F_2$, $CHF_3$, and/or $C_2F_6$), other suitable gases, or combinations thereof. The extent of which the semiconductor fins 204 is removed may be controlled by adjusting the duration of the etching process. In some embodiments, the etching process at operation 108 also removes portions of the dielectric layer 222 formed over a top surface of the dielectric layer 220.

Figure 5A:
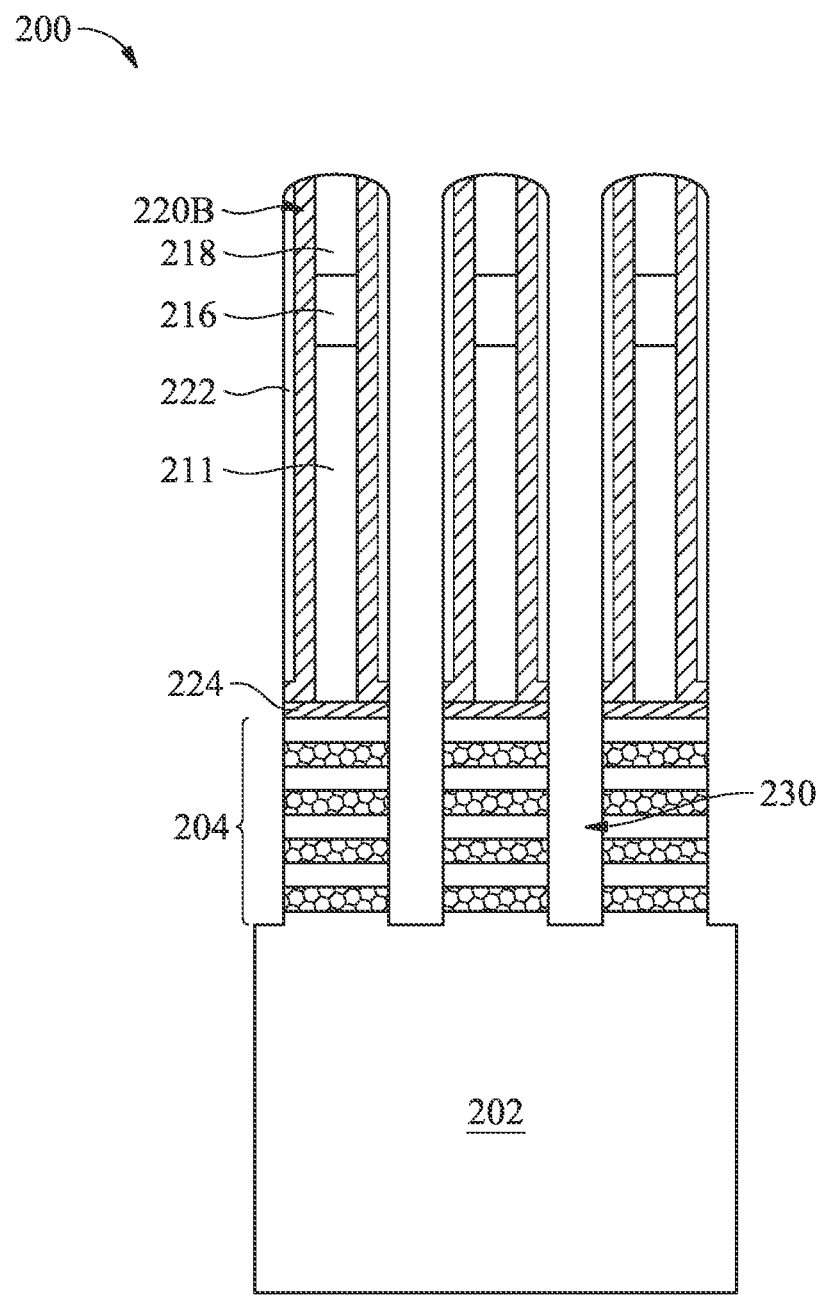
Figure 5B:
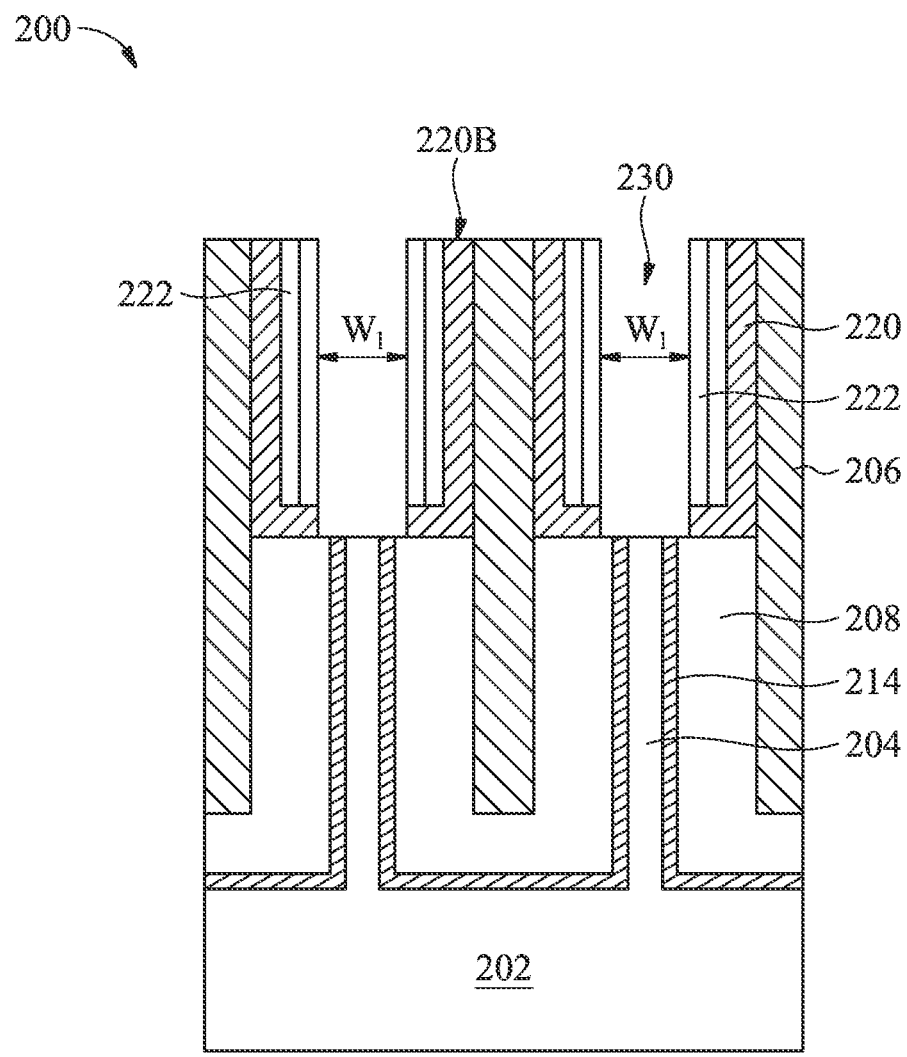

Referring to FIGS. 1A, 5A, and 5B, the method 100 at operation 110 removes the portions 220A of the dielectric layer 220, thereby laterally enlarging the recess 230. In many embodiments, the portions 220A are removed by a suitable etching process, such as an isotropic wet etching process. In some examples, the etching process may be implemented using a mixture of hydrofluoric acid (HF) and ammonia ($NH_3$) as etchant. Notably, the etching process at operation 110 selectively removes the portions 220A without removing or substantially removing the dielectric layer 222 and the dielectric fins 206. As such, an etching selectivity between the dielectric layer 220 and the dielectric layer 222 and/or the dielectric fins 206 may be at least 4 with respect to the etchant used during the etching process at operation 110. Due to the small opening of the recess 230, excess etchant may inadvertently remove a small amount of the portions 220B (e.g., a loss of about 7 nm to about 10 nm of height). However, such loss is minute and does not substantially affect the subsequent fabrication steps.

In some embodiments, operations 108 and 110 may be combined such that portions of the semiconductor fins 204 and the portion 220A of the dielectric layer 220 are removed in a single fabrication step. To accomplish this, the etching process for removing portions of the semiconductor fins 204 and the portion 220A may be fine-tuned such that the etching selectivity between the semiconductor fins 204 and the dielectric layer 222 and between the dielectric layer 220 and the dielectric layer 222 is large, but the etching selectivity between the semiconductor fins 204 and the dielectric layer 220 is minimal or insignificant. In some examples, the etching process may be a dry etching process for which the etching selectivity between the semiconductor fins 204 and the dielectric layer 222 (and between the dielectric layer 220 and the dielectric layer 222) may be at least 4. The dry etching process may be implemented using a bromine-containing etchant (e.g., HBr and/or $CHBr_3$), a fluorine-containing etchant (e.g., $CF_4$, $SF_6$, $CH_2F_2$, $CHF_3$, and/or $C_2F_6$), other suitable gases, or combinations thereof. Additionally, to achieve such etching selectivity, the dielectric layer 220 (including the portions 220A and 220B) may include a metal oxide material, such as aluminum oxide, hafnium oxide, zirconium oxide, other metal oxide materials, or combinations thereof.

In the depicted embodiment, referring back to FIG. 4B, due to the selective etching process at operation 108, a width w of the recess 230 is defined by a width of the semiconductor fin 204. When the portions 220A are subsequently removed during operation 110, referring to FIG. 5B, the width w increases to $w_1$, which accounts for both the width of the semiconductor fin 204 as well as the thickness of the dielectric layer 220 (i.e., the portions 220A). Therefore, the width $w_1$ may be tuned by adjusting the thickness of the dielectric layer 220 during the deposition process at operation 104 as discussed above. In some examples, the thickness of the dielectric layer 220 may be adjusted by adjusting the duration of the deposition process. In some examples, the width $w_1$ may range from about 20 nm to about 30 nm. Notably, because both the formation and the removal of the semiconductor fins 204 and the portions 220A are controlled as discussed above (e.g., conformal deposition and selective etching), the width $w_1$ is well-defined with little variation. Advantageously, because each recess 230 provides the space for subsequent epitaxial growth of a source/drain (S/D) feature, a well-defined width $w_1$ serves to keep uniform the size of the epitaxial S/D feature, thereby improving the resulting device performance.

Referring to back to FIG. 1A, for embodiments in which the semiconductor fins 204 includes two distinct semiconductor materials 204A and 204B, the method 100 proceeds to operations 112, 114, and 116 to form portions of a multi-gate device (e.g., a GAA FET). It is understood that operations 112, 114, and 116 discussed herein are mere examples, such that if other types of devices (e.g., FinFETs) are desired, the method 100 may directly proceed to operation 118 as illustrated in FIG. 1B.

Figure 6A:
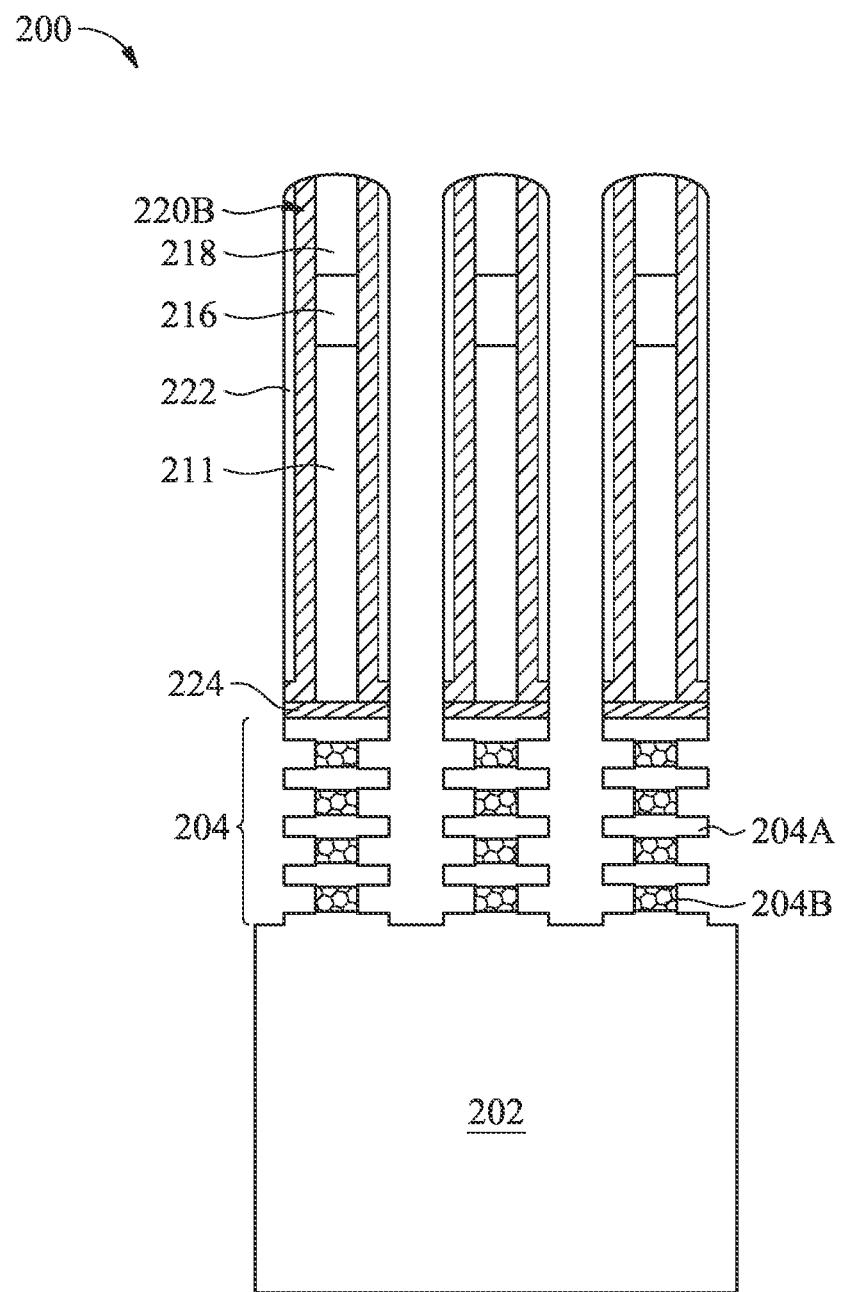
Figure 6B:
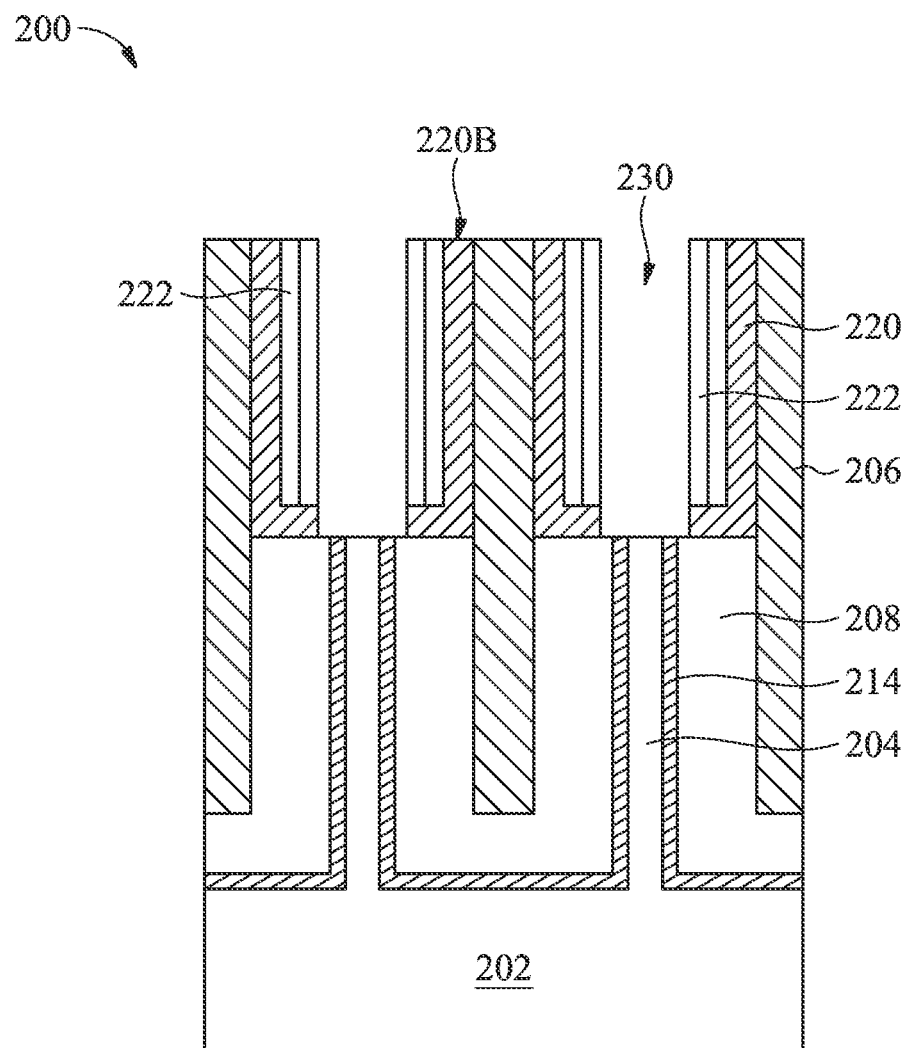

Referring to FIGS. 6A-6B, the method 100 at operation 112 selectively removes portions of the semiconductor material 204B by a suitable etching process to form gaps between layers of the semiconductor material 204A, such that portions of the semiconductor material 204A suspend in space. As discussed above, the semiconductor material 204A includes Si and the semiconductor material 204B includes SiGe. Accordingly, the etching process at operation 112 selectively removes portions of SiGe without removing or substantially remove Si. In some embodiments, the etching process is an isotropic etching process (e.g., a dry etching process or a wet etching process), and the extent of which the semiconductor material 204B is removed is controlled by duration of the etching process. In an example embodiment, the method 100 selectively removes portions of the semiconductor material 204B by a wet etching process that utilizes HF and/or NH$_4$OH as an etchant, which initially oxidizes portions of the semiconductor material 204B to form SiGeOx and subsequently removes the SiGeOx.

Figure 7A:
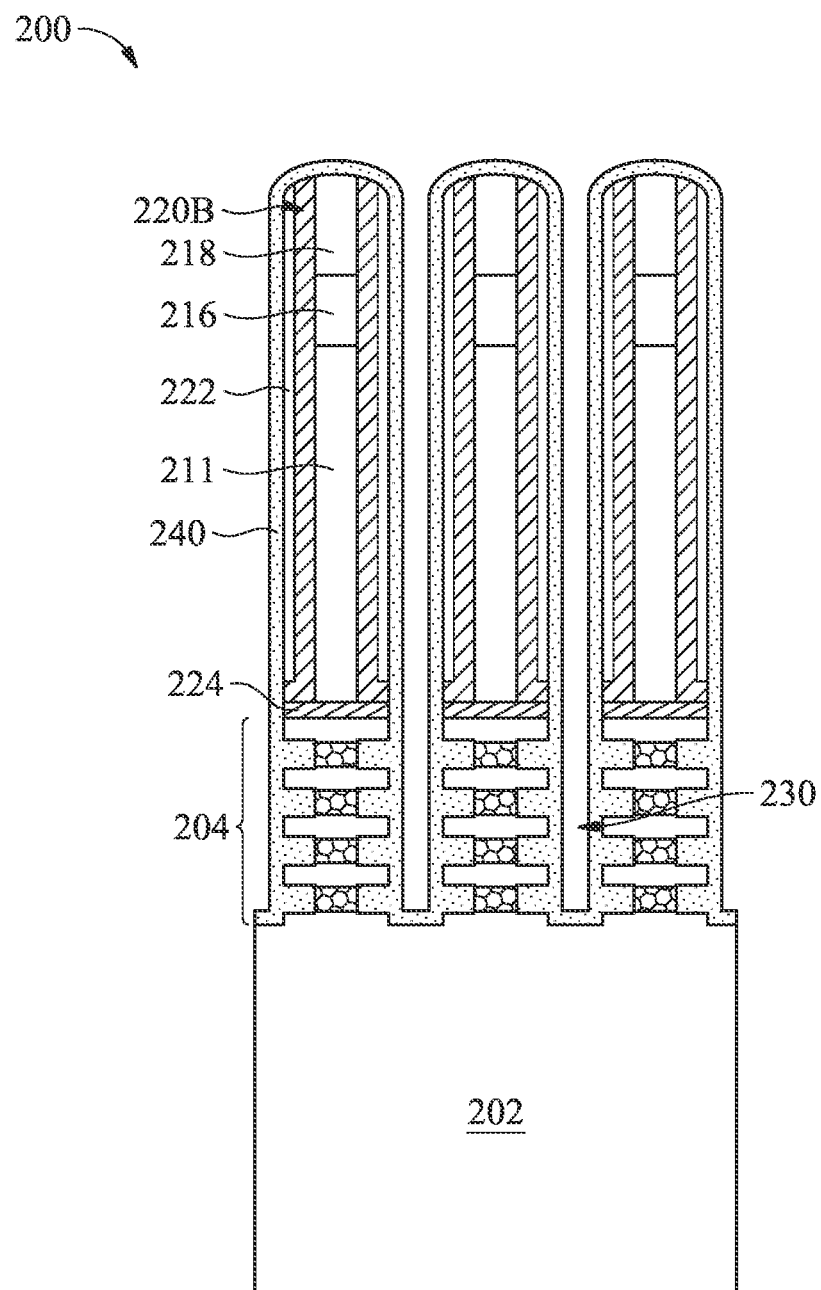
Figure 7B:
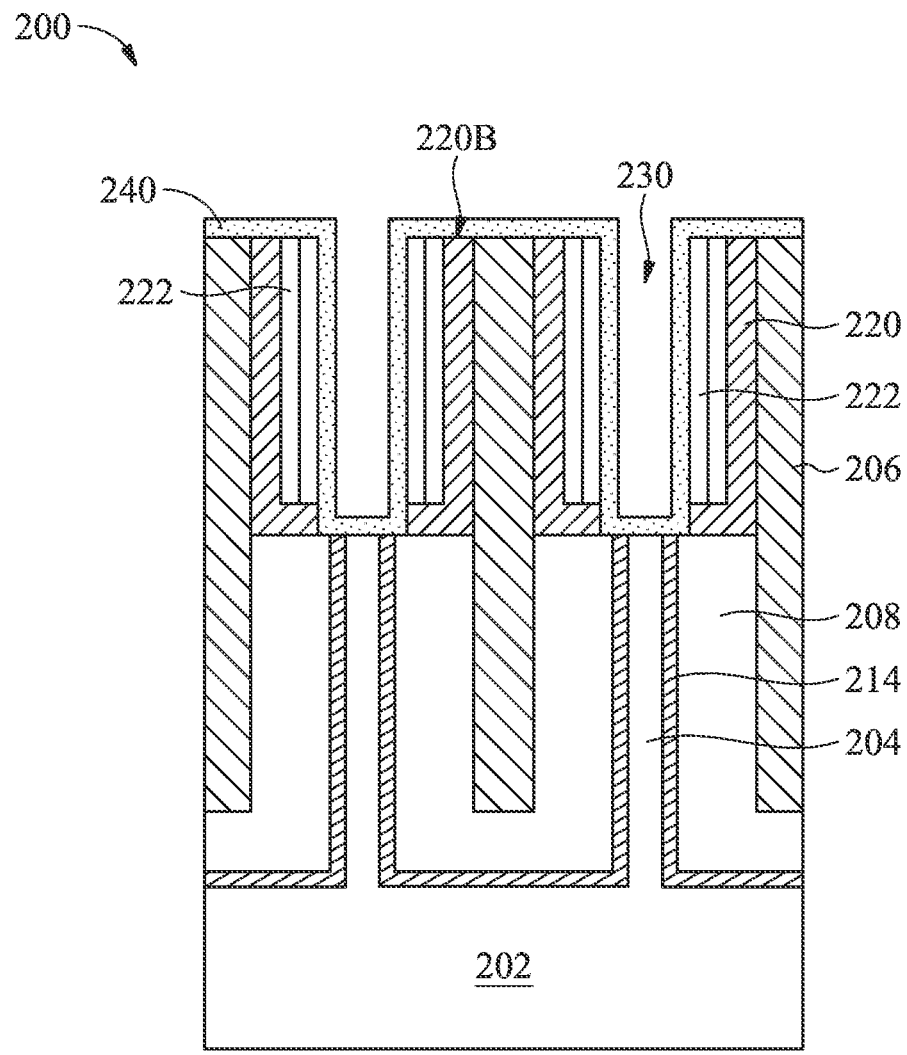

Now referring to FIGS. 1A, 7A, and 7B, the method 100 at operation 114 deposits a spacer layer 240 over the device 200. In many embodiments, the spacer layer 240 is formed conformally over the device 200 such that it is formed on sidewalls of the dummy gate stacks 210 and the remaining portions of the semiconductor fins 204 (i.e., including the semiconductor materials 204A and 204B). In the depicted embodiments, the spacer layer 240 is formed on the dielectric layer 222 and on top surfaces of the portion 220B and the dielectric fins 206. Referring to FIG. 7A, the spacer layer 240 may fill up the space between layers of the semiconductor material 204A. In some embodiments, the spacer layer 240 is deposited by any suitable method, such as ALD, to any suitable thickness. In some examples, the spacer layer 240 may include any suitable dielectric material, such as silicon nitride, silicon oxide, silicon carboxynitride, silicon oxycarbide, other suitable dielectric materials, or combinations thereof.

Figure 8A:
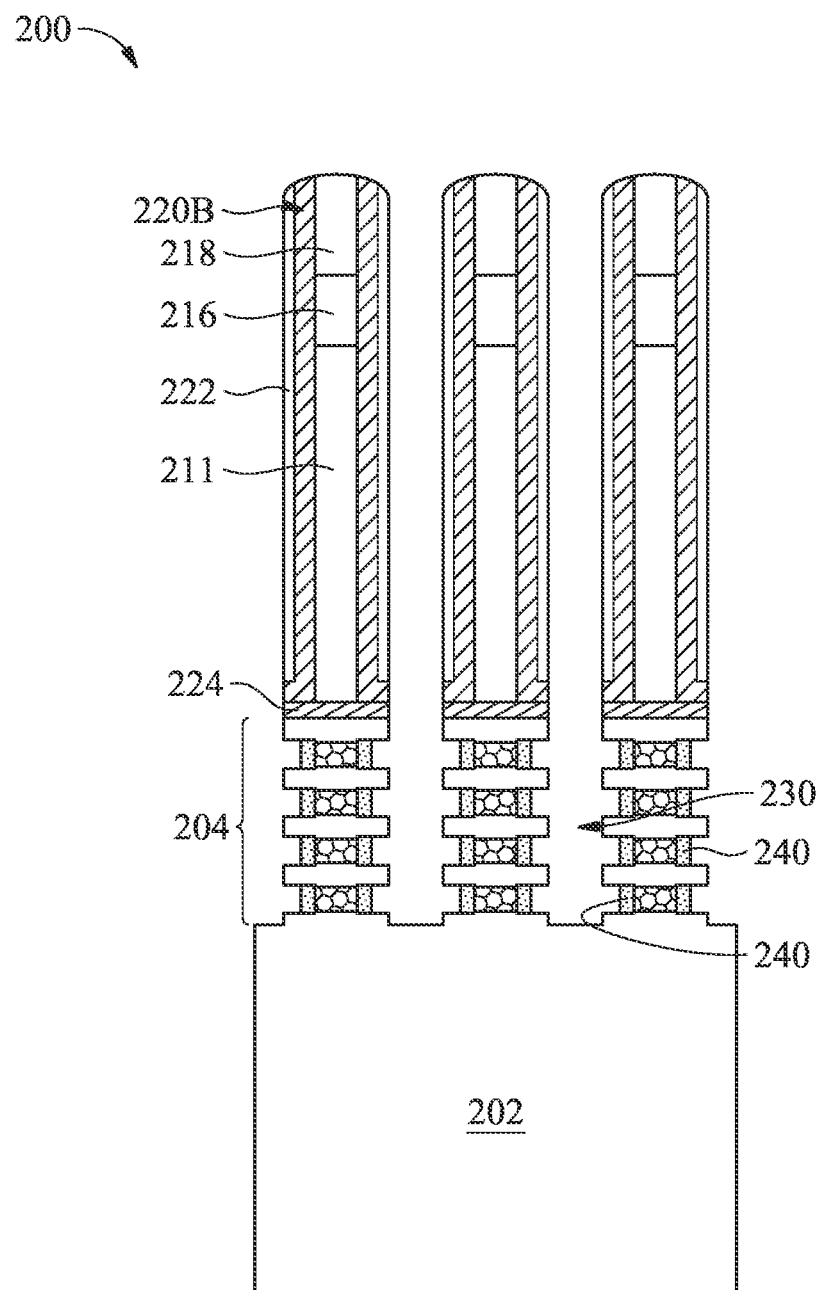
Figure 8B:
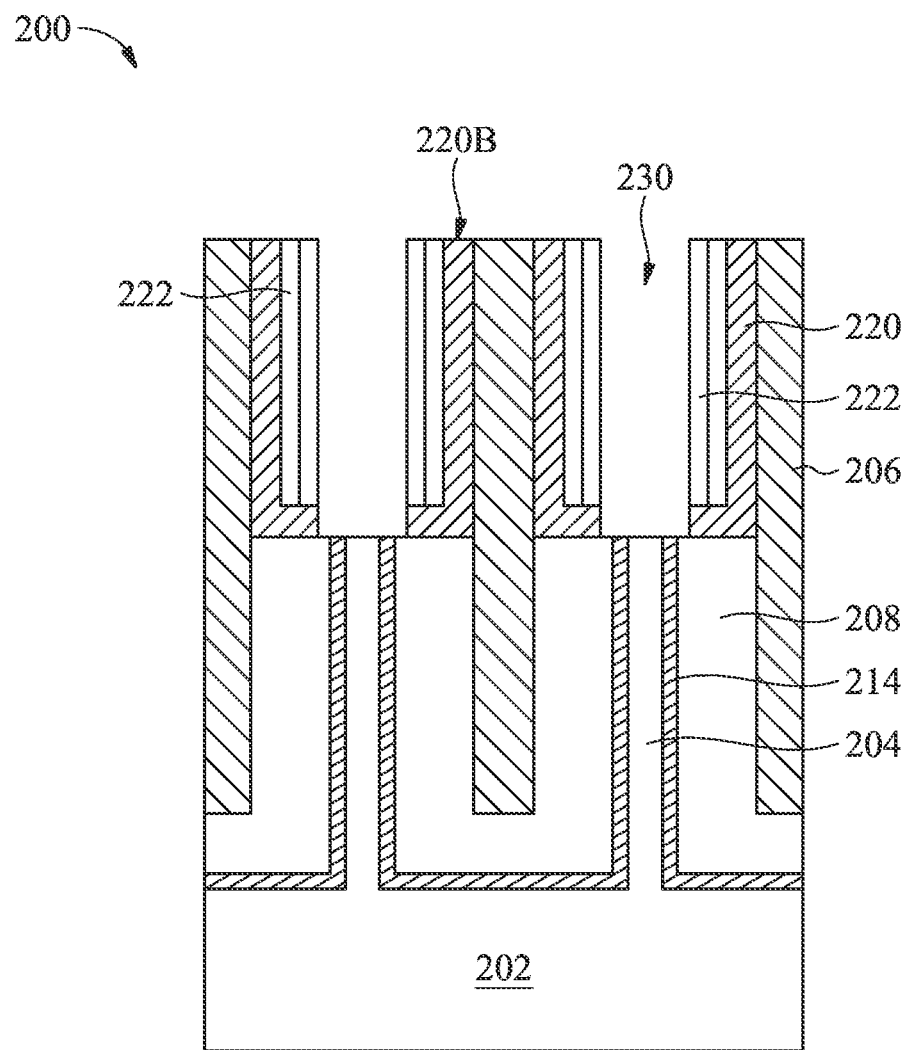

Thereafter, referring to FIGS. 1A, 8A, and 8B, the method 100 at operation 116 removes portions of the spacer layer 240 in an etching process such that only portions of the spacer layer 240 remain on sidewalls of the semiconductor material 204B. The remaining portions of the spacer layer 240 form spacers on exposed sidewalls of the semiconductor material 204B and are configured to facilitate subsequent fabrication steps for forming multi-gate devices. In some examples, the remaining portions of the spacer layer 240 are configured to reduce parasitic capacitance of the resulting multi-gate devices. In some embodiments, the etching process at operation 116 is an isotropic etching process, and the extent of which the spacer layer 240 is removed is controlled by duration of the etching process. In some examples, a thickness of the spacer layer 240 removed by the etching process at operation 116 may be about 3 nm to about 7 nm. Of course, the present disclosure is not limited to this range of dimensions.

Figure 9A:
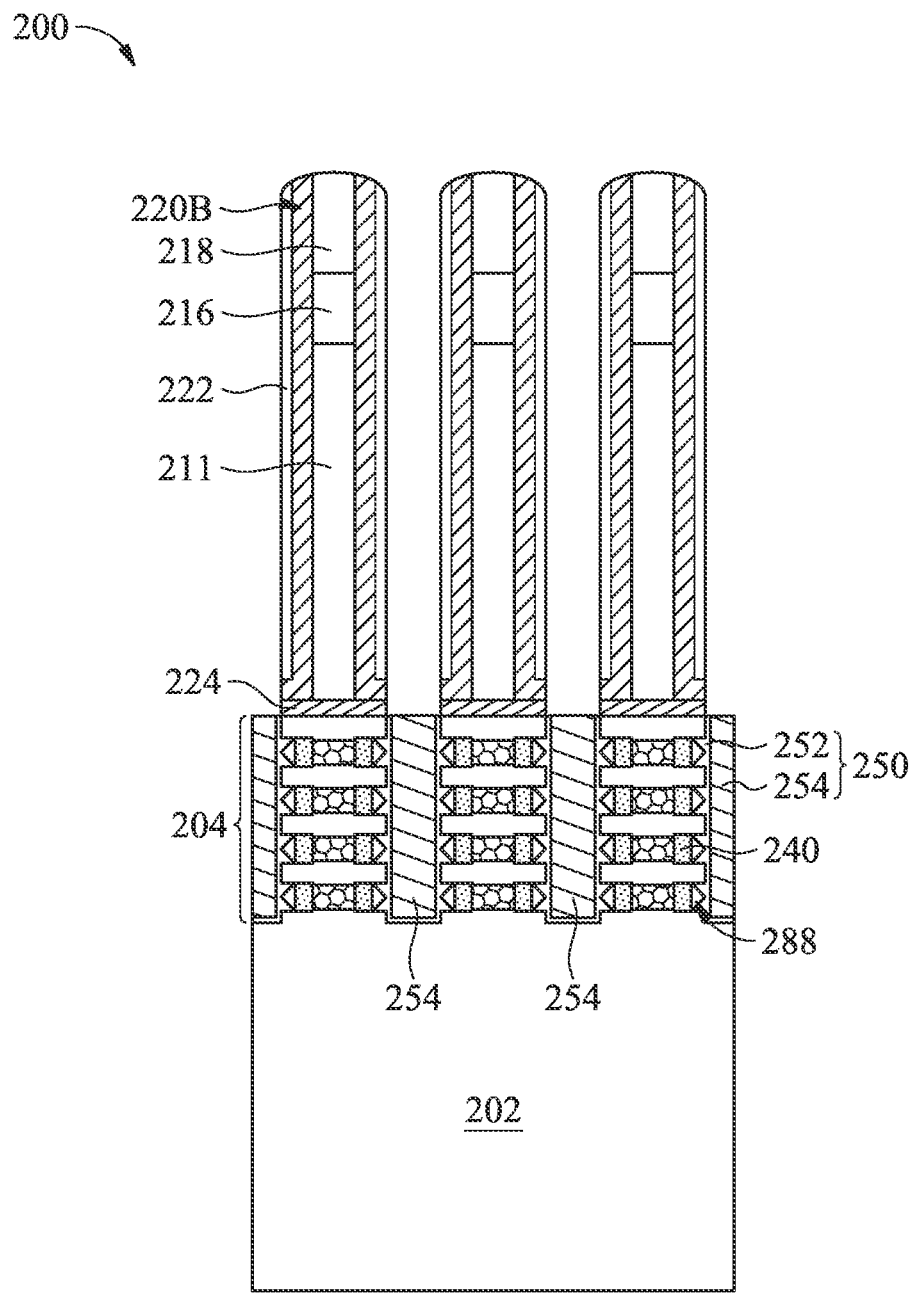
Figure 9B:
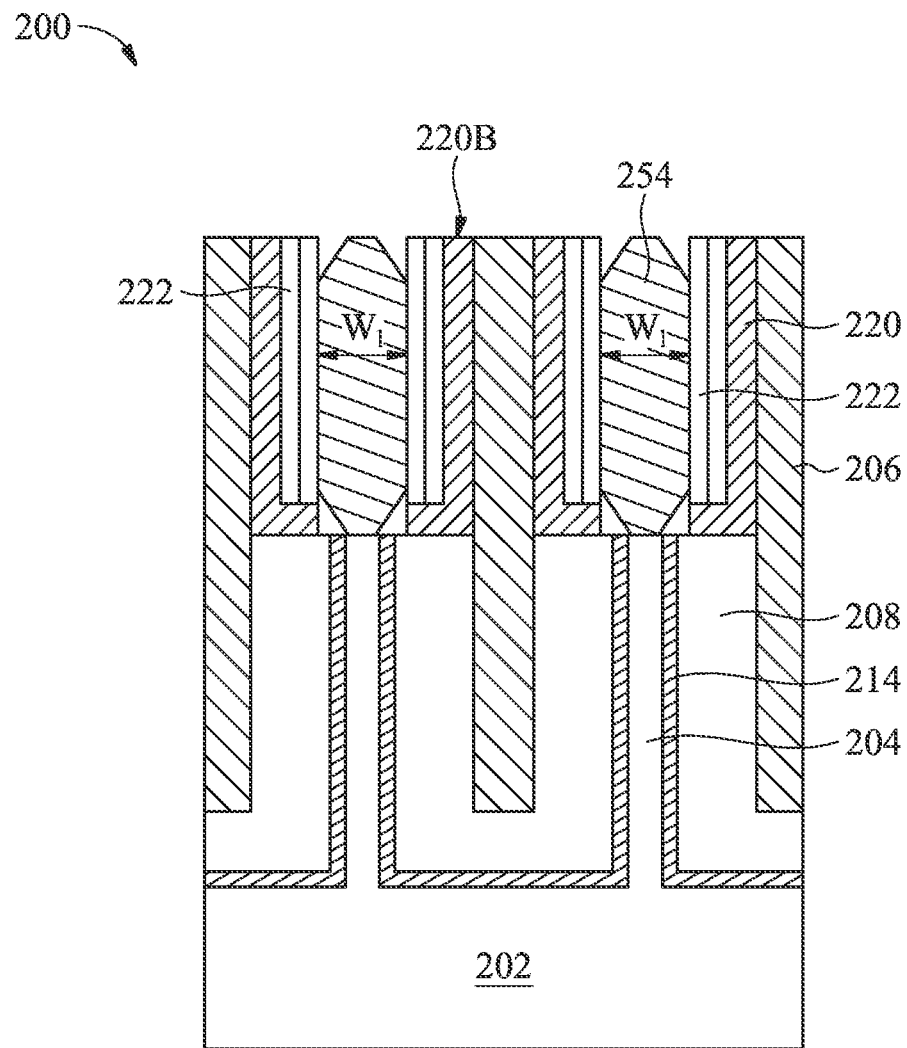

Referring to FIGS. 1B, 9A, and 9B, the method 100 proceeds to operation 118 to form an epitaxial S/D feature 250 in the recess 230. Referring to FIG. 9A, the epitaxial S/D feature 250 may include multiple epitaxial semiconductor layers, e.g., a layer 252 and a layer 254. In some embodiments, the layers 252 and 254 differ in amount of dopant included therein. In some examples, the amount of dopant included in the layer 252 is less than that included in the layer 254; of course, the present disclosure is not limited to this configuration. Referring to FIG. 9B, the epitaxial S/D feature 250 (only the layer 254 is depicted in this view) is formed in the recess 230 and along sidewalls of the dielectric layer 222. In other words, the growth of the epitaxial S/D feature 250 is laterally confined by the width w$_1$ of the recess 230. As discussed above, because the recess 230 has a well-defined width w$_1$ formed as a result of controlled deposition and selective etching of the semiconductor fins 204 and the portions 220A of the dielectric layer 220, the size of the epitaxial S/D feature 250 may also be well controlled to substantially uniform sizes (i.e., having the width w$_1$) with little variations. In many embodiments, the width w$_1$ of each epitaxial S/D feature 250 is defined by a width of each semiconductor fin 204 and a thickness of the dielectric layer 220 (see FIGS. 4B and 5B). In the depicted embodiment, a bottom portion of each epitaxial S/D feature 250 and the dielectric layer 220 is separated by an air gap 288; however, the present disclosure is not limited to such configuration.

The epitaxial S/D feature 250 (i.e., the layers 252 and 254 included therein) may be formed by any suitable method, such as MBE, MOCVD, other suitable epitaxial growth processes, or combinations thereof. The epitaxial S/D feature 250 may be suitable for a p-type FinFET device (e.g., a p-type epitaxial material) or alternatively, an n-type FinFET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopant.

Figure 10A:
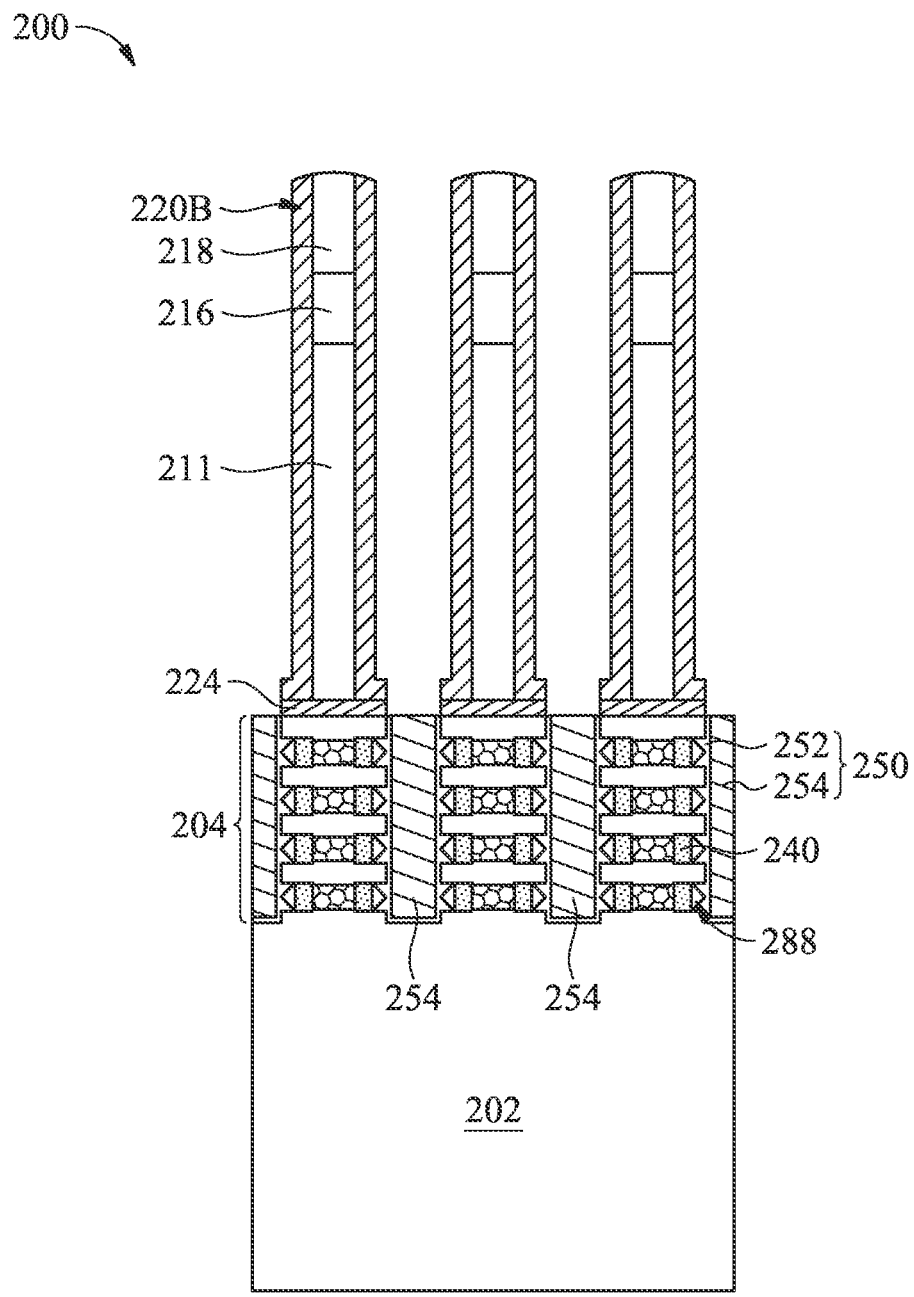
Figure 10B:
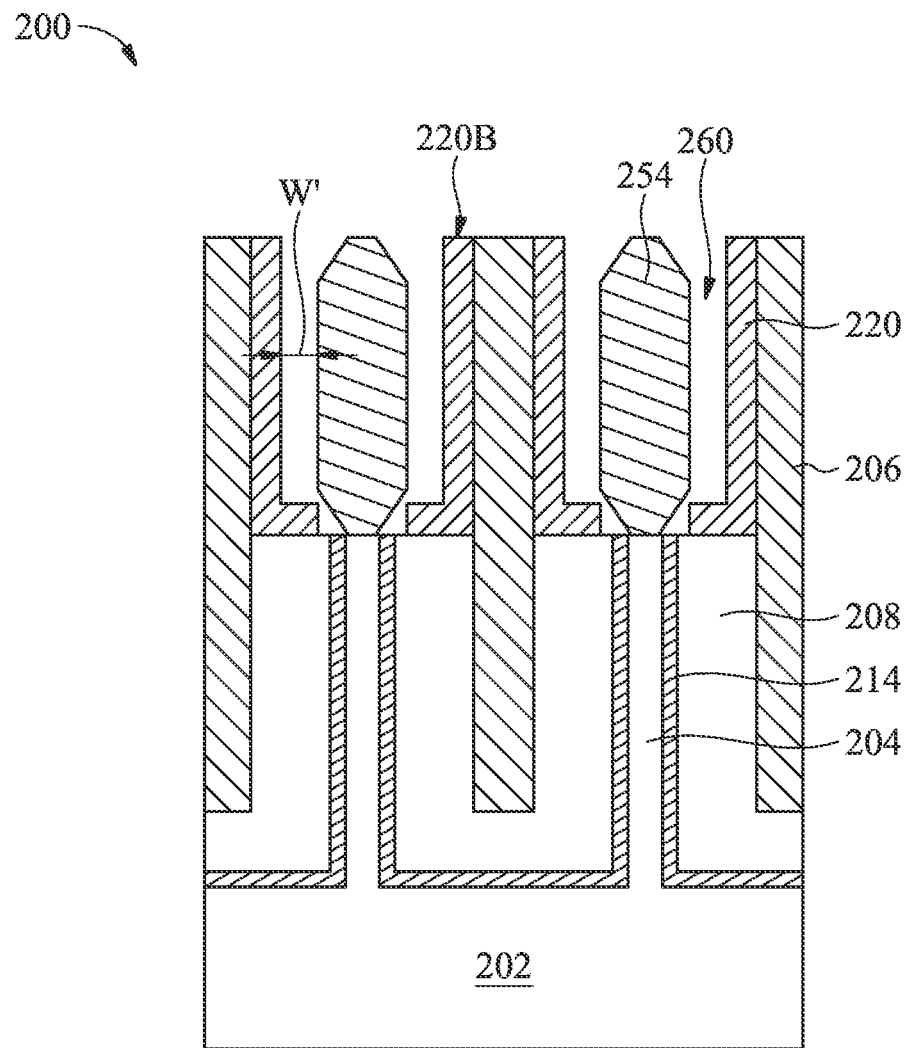

Referring to FIGS. 1B, 10A, and 10B, the method 100 at operation 120 selective removes the dielectric layer 222 by any suitable etching process to form a recess 260 adjacent to the epitaxial S/D feature 250 (e.g., the layer 254). In many embodiments, the etching process removes the dielectric layer 222 disposed between the epitaxial S/D features 250 and the portions 220B of the dielectric layer 220. The etching process may implement any suitable etchant configured to remove the dielectric layer 222 without removing or substantially removing the epitaxial S/D features 250 and the dielectric layer 220. In some examples, the etching process may be an isotropic etching process (e.g., an isotropic dry etching or an isotropic wet etching process) that implements an etchant that includes hydrofluoric acid (HF), ammonia (NH$_3$), nitrogen trifluoride (NF$_3$), other suitable etchants, or combinations thereof. Similar to the formation of the recess 230, the recess 260 is configured to have well-defined width w' determined by the thickness of the dielectric layer 222. Accordingly, when selectively removed at operation 120, the width w' of the recess 260 may thus be uniform or substantially uniform. In some examples, the width w' ranges from about 5 nm to about 15 nm. In many embodiments, as discussed below, the recess 260 is configured to accommodate the formation of a silicide layer that wraps the epitaxial S/D feature 250.

Figure 11A:
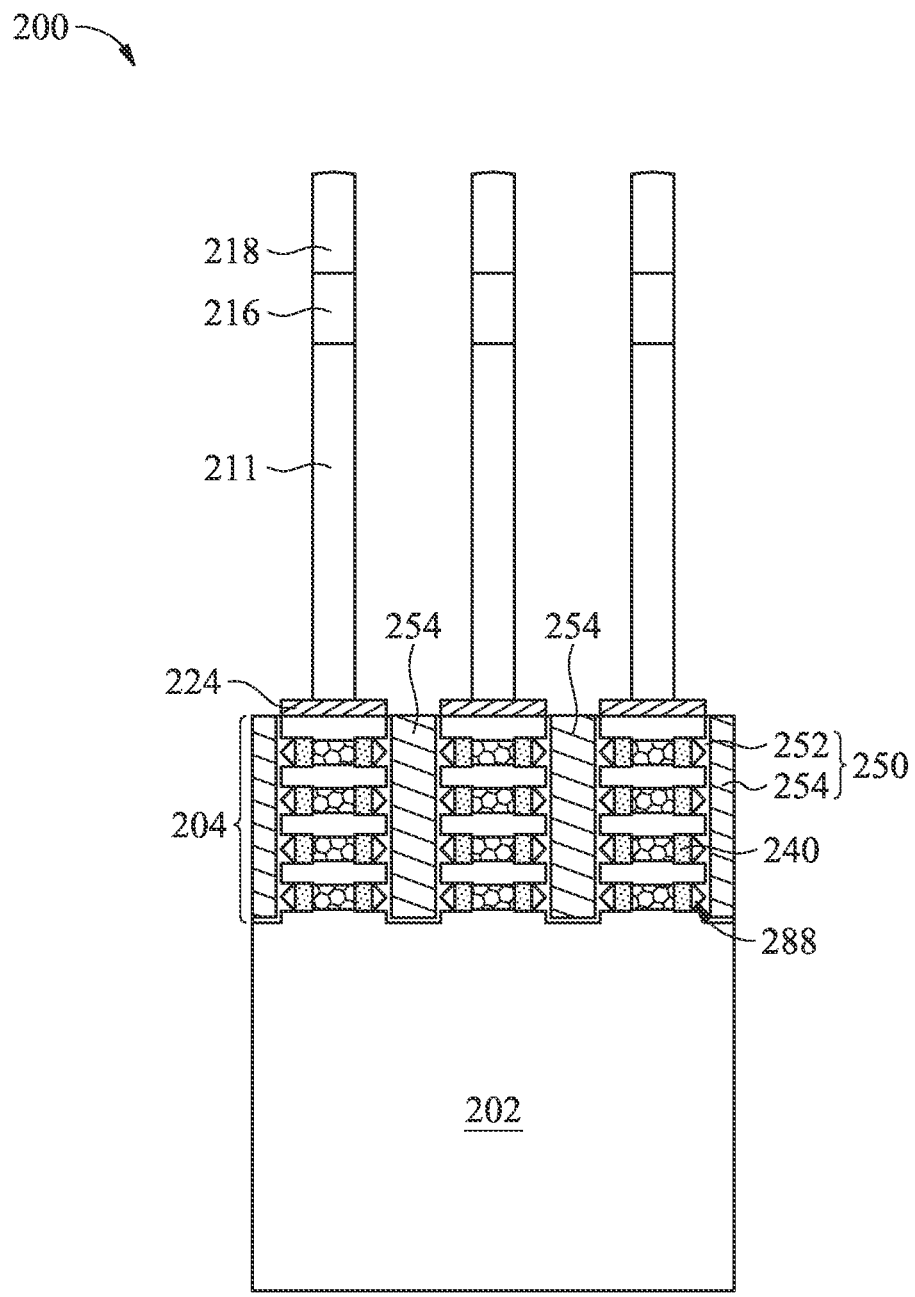
Figure 11B:
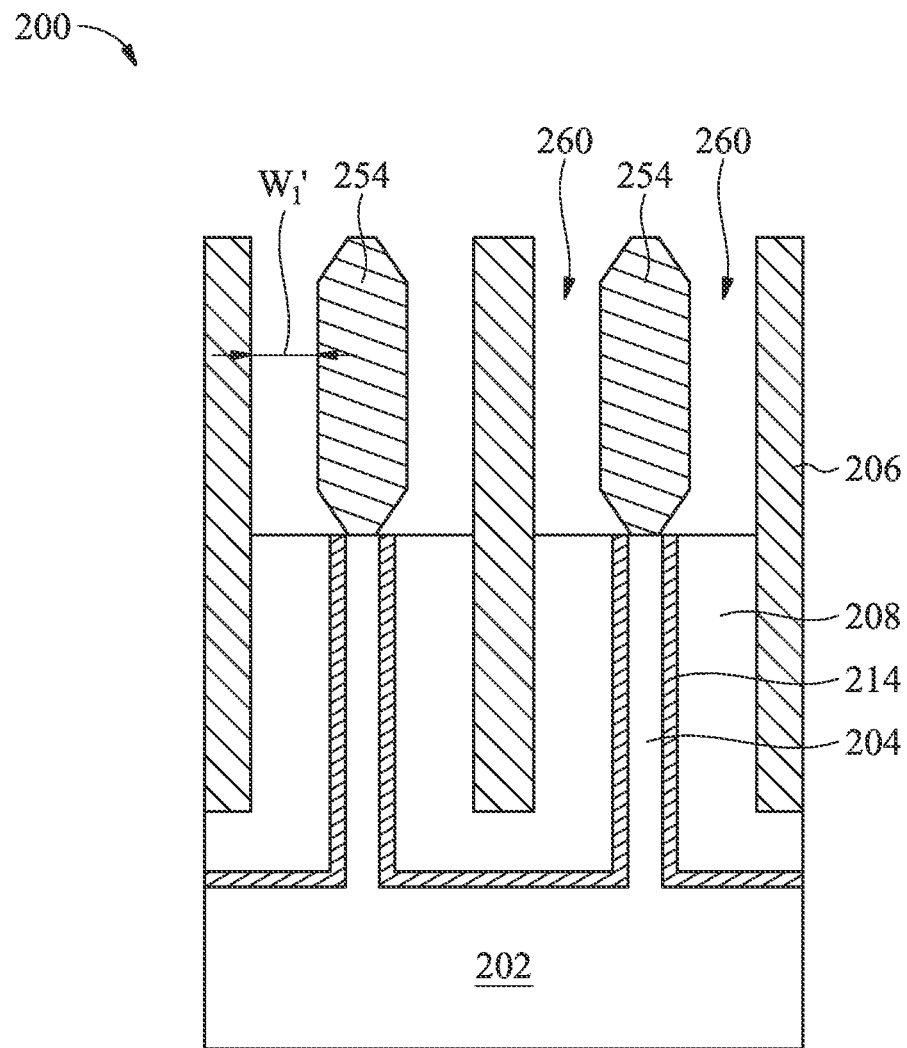

Referring to FIGS. 1B, 11A, and 11B, the method 100 may proceed to an operation 122 during which the remaining portions (i.e., the portions 220B) of the dielectric layer 220 are selectively removed by a suitable etching process, thereby enlarging the recess 260 to a width w$_1$'. Operation 122 may be implemented by an isotropic dry or wet etching process using a combination of HF, NH$_3$, and/or NF$_3$ as an etchant. In some embodiments, the etching recipe for removing the remaining portions of the dielectric layer 220 is similar to that for removing the dielectric layer 222; however, the etching selectivity would be fine-tuned such that the etching process at operation 122 selectively removes the dielectric layer 220 without etching or substantially etching the dielectric fins 206 or the epitaxial S/D feature 250. In some embodiments, enlarging the recess 260 may be implemented in instances where an air gap disposed between the epitaxial S/D feature 250 and the dielectric fin 206 is desired to, for example, reduce the parasitic capacitance of the device 200. Alternatively or additionally, it may be desirable to enlarge the recess 260 to accommodate deposition of a silicide layer (e.g., the silicide layer 270 discussed below) for device performance and/or deposition capability consideration. In some embodiments, the operation 122 may be omitted from the method 100, i.e., the method 100 may proceed from operation 120 to operation 124 directly.

Figure 12A:
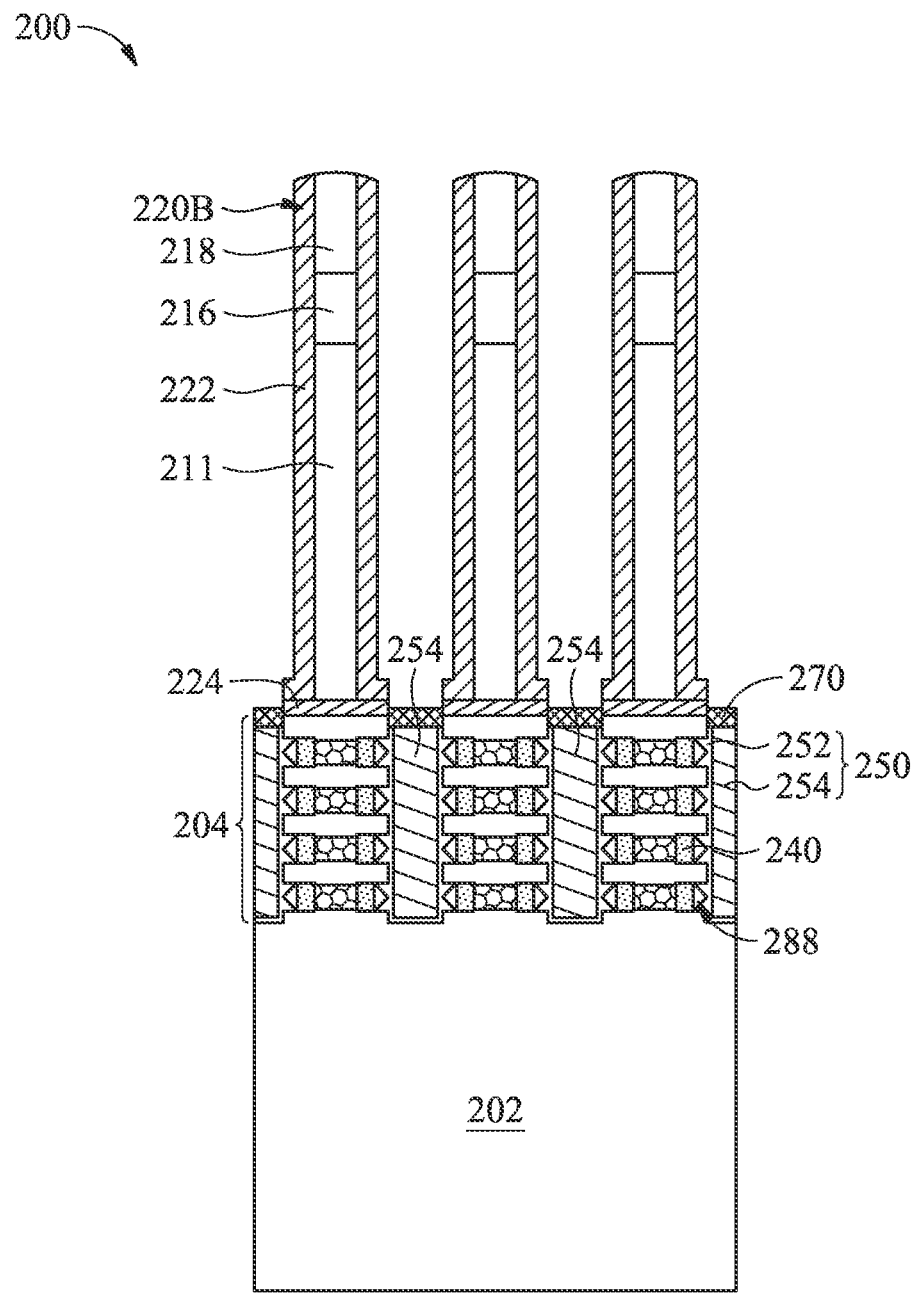
Figure 12B:
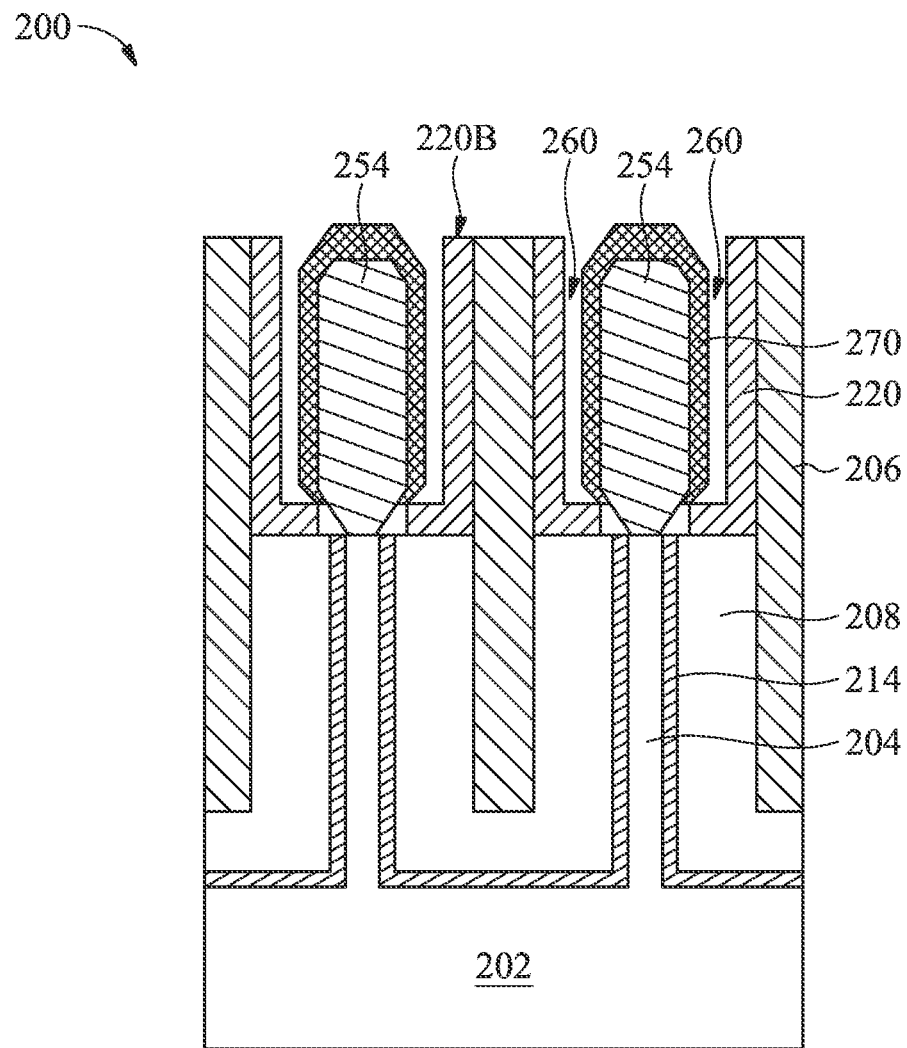

Referring to FIGS. 1B, 12A, and 12B, the method 100 at operation 124 forms a silicide layer 270 over the epitaxial S/D feature 250 in the recess 260, such that the silicide layer 270 wraps around the epitaxial S/D feature 250 (e.g., the layer 254 as depicted in FIG. 12B). In many embodiments, the silicide layer 270 includes nickel silicide, cobalt silicide, tungsten silicide, tantalum silicide, titanium silicide, platinum silicide, erbium silicide, palladium silicide, other suitable silicide, or combinations thereof. The silicide layer 270 may be formed by any suitable method. In one example, a metal layer (e.g., nickel) may be deposited over the device 200 by a deposition process such as CVD, ALD, PVD, other suitable processes, or combinations thereof. Then, the device 200 is annealed to allow the metal layer and the semiconductor materials of the epitaxial S/D feature 250 to react and form the silicide layer 270. Thereafter, the unreacted metal layer is removed, leaving the silicide layer 270 over the epitaxial S/D feature 250. In another example, a metal layer may be selectively deposited over the semiconductor materials of the epitaxial S/D feature 250 by a suitable deposition method provided herein. Thereafter, the device 200 is annealed to form the silicide layer 270 over the epitaxial S/D feature 250 in the recess 260. In some embodiments, depending upon the specific value of the width $w_1'$ of the recess 260, the silicide layer 270 partially or completely fills the recess 260 at operation 124. In some examples, the silicide layer 270 may be formed to a thickness of about 5 nm to about 10 nm, which may range from about 30% to about 100% of the width $w_1'$ of the recess 260. As such, depending upon the thickness of the silicide layer 270, an air gap 294 may remain between the portions 220B and the silicide layer 270 after forming the silicide layer 270 at operation 124.

Notably, because operation 124 is implemented after recessing the dielectric layer 222 and before forming an S/D contact, the recess 260 provides space for the silicide layer 270 to be formed on exposed surfaces of the epitaxial S/D feature 250, such that the silicide layer 270 wraps around the epitaxial S/D feature 250. Advantageously, embodiments provided herein increase the contact area between the silicide layer 270 and the epitaxial S/D feature 250, thereby reducing the contact resistance between the epitaxial S/D features 250 and the S/D contact formed hereafter.

Figure 13A:
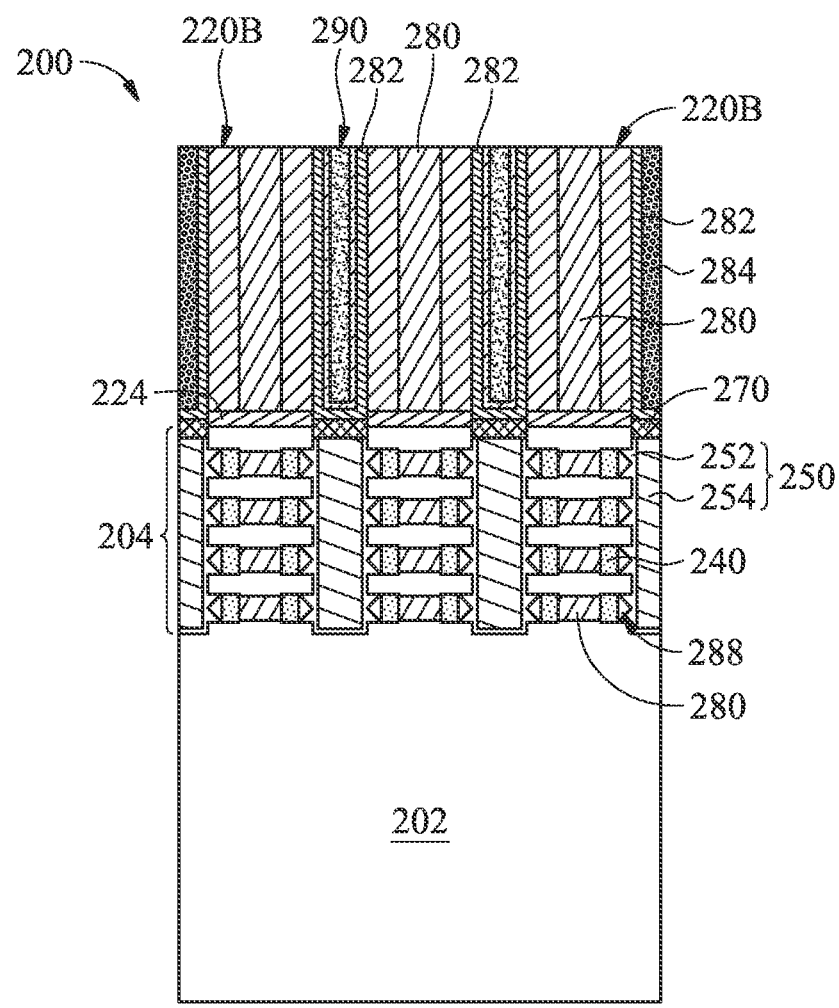
Figure 13B:
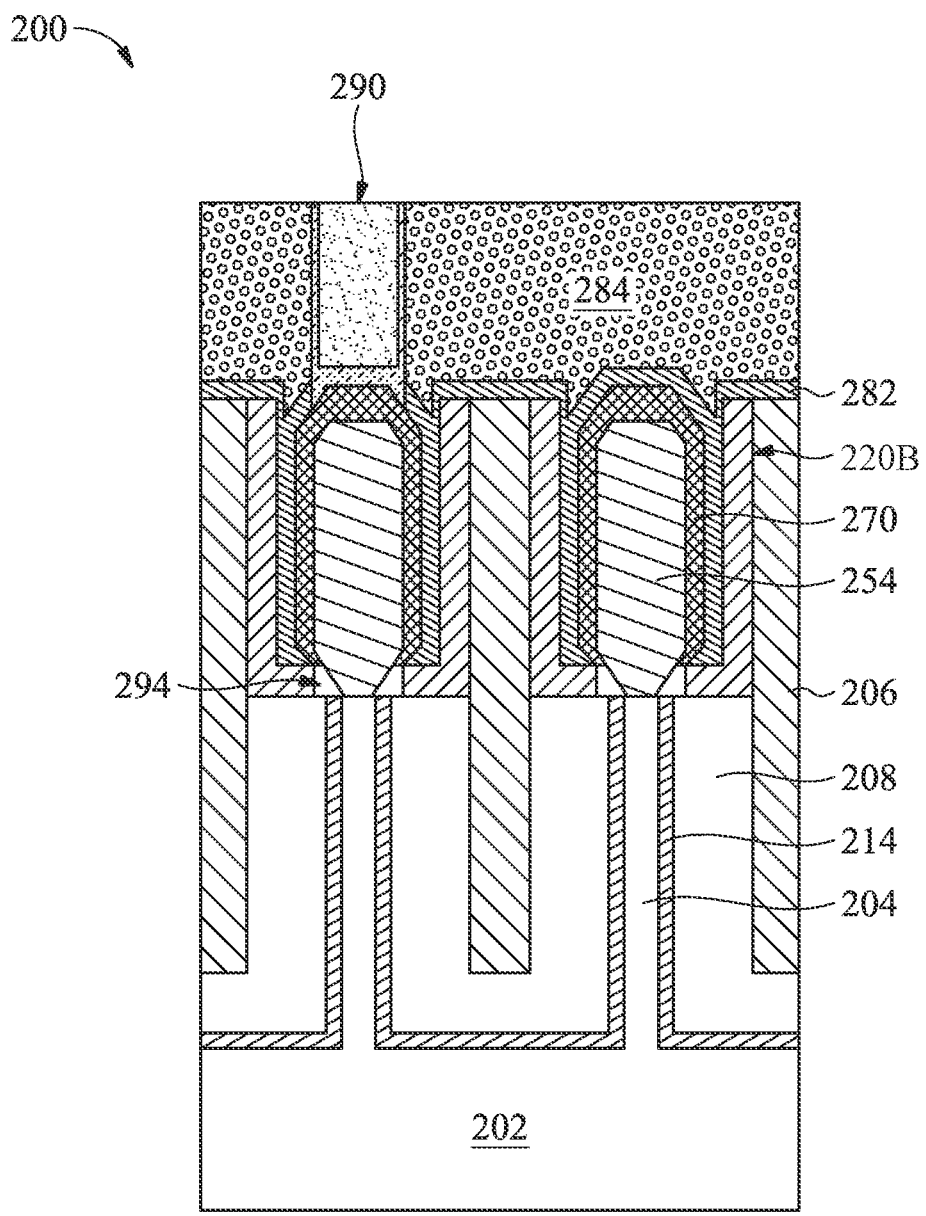

Referring to FIGS. 1B, 13A, and 13B, the method 100 at operation 126 replaces the dummy gate stack 210 with a metal gate structure 280 in a gate replacement process. In the present embodiments, the metal gate structure 280 is a high-k metal gate structure (HKMG), where "high-k" indicates that the metal gate structure 280 includes a gate dielectric layer having a dielectric constant greater than that of silicon oxide (about 3.9). The gate replacement process at operation 126 may be implemented in a series of fabrication steps as discussed in detail below.

In some embodiments, the method 100 first deposits a contact etch-stop layer (CESL) 282 over the device 200. The CESL 282 may include silicon nitride, silicon oxynitride, silicon nitride with oxygen or carbon elements, other suitable materials, or combinations thereof, and may be formed by CVD, PVD, ALD, other suitable methods, or combinations thereof. The method 100 then deposits an interlayer dielectric (ILD) layer 284 over the CESL 282. The ILD layer 284 includes a dielectric material, such as tetraethylorthosilicate (TEOS), un-doped silicate glass, or doped silicon oxide such as borophosphosilicate glass (BPSG), fluorine-doped silicate glass (FSG), phosphosilicate glass (PSG), boron doped silicon glass (BSG), other suitable dielectric materials, or combinations thereof. The ILD layer 284 may include a multi-layer structure having multiple dielectric materials and may be formed by a deposition process such as, for example, CVD, flowable CVD (FCVD), spin-on-glass (SOG), other suitable methods, or combinations thereof. In some embodiments, forming the ILD layer 284 further includes performing a CMP process to planarize a top surface of the device 200, such that a top surface of the dummy gate stack 210 is exposed.

For embodiments in which a multi-gate device (e.g., a GAA FET) is desired, referring to FIG. 13A for example, before forming the CESL 282 and/or the ILD layer 284, the semiconductor layers 204B (including SiGe) are selectively removed from the semiconductor fins 204 in an etching process, such that voids or gaps (not depicted) are formed between stacks of the semiconductor layers 204A (including Si). In some embodiments, the etching process may be a dry etching process or a wet etching process. In an example embodiment, the method 100 selectively removes portions of the semiconductor material 204B by a wet etching process that utilizes HF and/or $NH_4OH$ as an etchant.

Thereafter, the method 100 at operation 126 removes the dummy gate stack 210 by any suitable method to form a gate trench (not depicted) over the semiconductor fins 204. Forming the gate trench may include one or more etching processes that are selective to the materials included in the dummy gate stack 210 (e.g., the polysilicon included in the dummy gate electrode 211). The etching processes may include dry etching, wet etching, RIE, or other suitable etching methods, or combinations thereof.

Then, the method 100 proceeds to forming the metal gate structure 280 in the gate trench. For embodiments in which the semiconductor fin 204 includes alternating stacks of the semiconductor materials 204A and 204B, various material layers of the metal gate structure 280 are also deposited in the gaps formed between the layers of the semiconductor material 204A after the semiconductor material 204B is removed from the device 200. Though not depicted, the metal gate structure 280 may include multiple material layers, such as a high-k gate dielectric layer formed over the interfacial layer 224, a work function metal layer formed over the high-k gate dielectric layer, a bulk conductive layer formed over the work function metal layer, other suitable layers, or combinations thereof. The metal gate structure 280 may include other material layers, such as a barrier layer, a glue layer, a hard mask layer, and/or a capping layer. The high-k dielectric layer may include one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The work function metal layer may include any suitable material, such as titanium nitride (TiN), tantalum nitride (TaN), ruthenium (Ru), molybdenum (Mo), tungsten (W), platinum (Pt), titanium (Ti), aluminum (Al), tantalum carbide (TaC), tantalum carbide nitride (TaCN), tantalum silicon nitride (TaSiN), titanium silicon nitride (TiSiN), other suitable materials, or combinations thereof. In some embodiments, the work function metal layer includes multiple material layers of the same or different types (i.e., both n-type work function metal or both p-type work function metal) in order to achieve a desired threshold voltage. The bulk conductive layer may include aluminum (Al), copper (Cu), tungsten (W), cobalt (Co), ruthenium (Ru), other suitable conductive materials, or combinations thereof. The various layers of the metal gate structure 280 may be formed by any suitable method, such as CVD, ALD, PVD, plating, chemical oxidation, thermal oxidation, other suitable methods, or combinations thereof. Thereafter, the method 100 may perform one or more polishing process (e.g., CMP) to remove any excess conductive materials and planarize the top surface of the device 200.

Figure 14A:
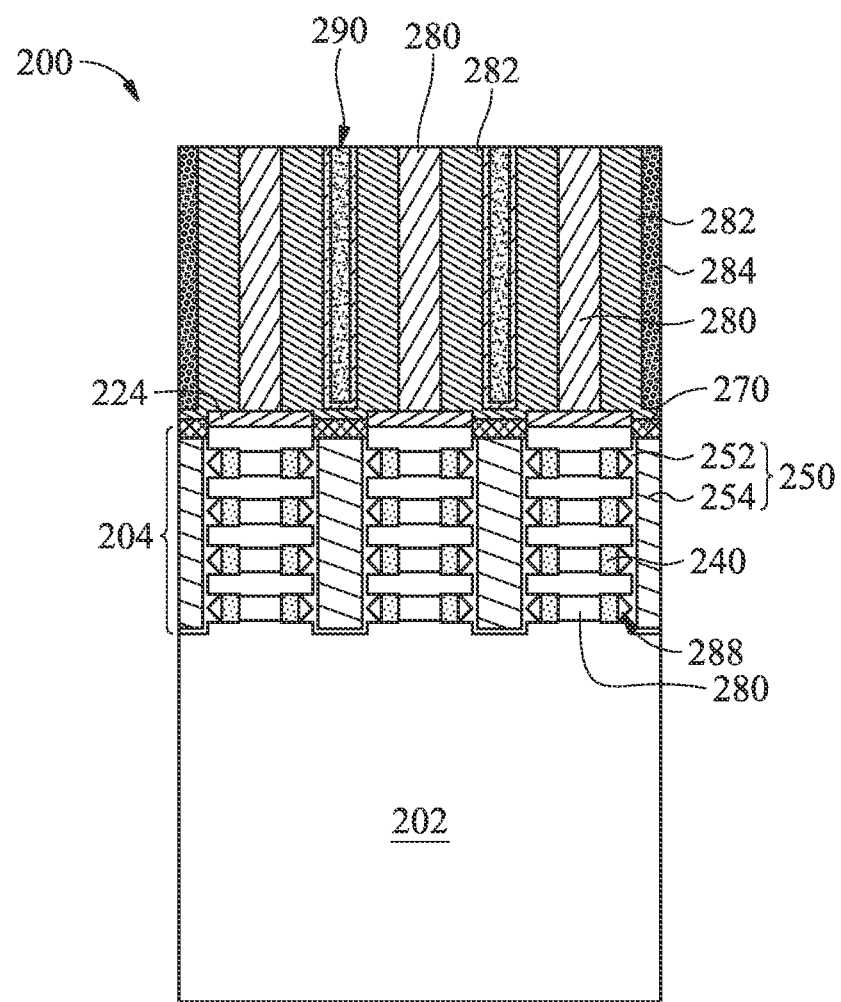
Figure 14B:
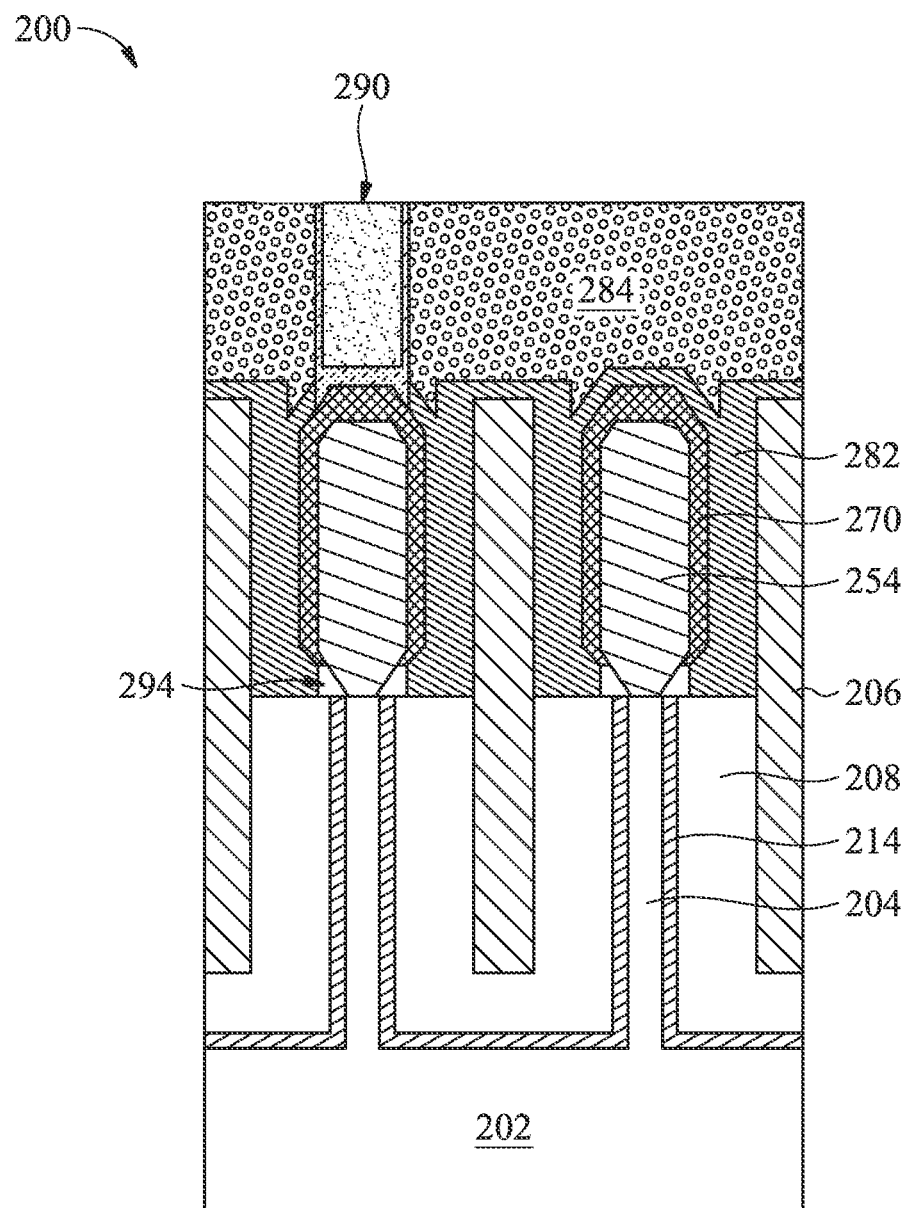

Referring to FIGS. 14A and 14B, illustrated are views of an example embodiment of the device 200 after the implementation of operations 122 and 126, i.e., after the remaining portions (i.e., the portions 220B) of the dielectric layer 220 are selectively removed. The example embodiment shown in FIGS. 14A and 14B is similar to that illustrated in FIGS. 13A and 13B, respectively, with the exception that the CESL 282 is disposed on sidewalls of the metal gate structure 280 as shown in FIG. 14A and between sidewalls of the semiconductor fins 204 and the dielectric fins 206 as shown in FIG. 14B.

Referring to FIG. 1B, the method 100 at operation 128 may perform additional processing steps. For example, additional vertical interconnect features such as an S/D contact 290 as depicted in FIGS. 13B and 14B and/or vias, and/or horizontal interconnect features such as lines, and multilayer interconnect features such as metal layers and interlayer dielectrics can be formed over the device 200. The various interconnect features may implement various conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, other suitable materials, or combinations thereof. The metal silicides may include nickel silicide, cobalt silicide, tungsten silicide, tantalum silicide, titanium silicide, platinum silicide, erbium silicide, palladium silicide, other suitable metal silicides, or combinations thereof.

Although not intended to be limiting, one or more embodiments of the present disclosure provide many benefits to a semiconductor device and the formation thereof. The present disclosure provides methods of forming a silicide layer over an epitaxial S/D feature. Embodiments of the present disclosure includes forming a silicide layer that wraps around the epitaxial S/D feature. In many embodiments, sequential removal (e.g., selective etching) of multiple fin sidewall spacers is configured to define spaces in which the epitaxial S/D feature and the silicide layer are formed before forming contact trenches (or contact holes). Accordingly, adequate processing window for forming uniformly sized epitaxial S/D features and wrap-around silicide layer are provided for purposes of reducing contact resistance between the epitaxial S/D features and the S/D contacts.

In one aspect, the present disclosure provides a semiconductor structure that includes a semiconductor fin extending from a substrate, a source/drain (S/D) feature disposed over the semiconductor fin, a silicide layer disposed over the S/D feature, where the silicide layer extends along a sidewall of the S/D feature, and an etch-stop layer (ESL) disposed along a sidewall of the silicide layer.

In another aspect, the present disclosure provides a semiconductor structure that includes a semiconductor fin extending from a substrate, an S/D feature disposed over the semiconductor fin, a silicide layer wrapping around the S/D feature, an ESL disposed along and in direct contact with sidewalls of the silicide layer, and an air gap exposing a bottom portion of the S/D feature.

In yet another aspect, the present disclosure provides a semiconductor structure that includes a semiconductor fin extending from a substrate, an S/D feature disposed over the semiconductor fin, a silicide layer disposed along and directly contacting the S/D feature, an ESL extending along sidewalls of the silicide layer, and an air gap disposed below a bottom portion of the S/D feature.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
providing a workpiece comprising a gate structure over a semiconductor fin that protrudes from a substrate;
forming a dielectric structure extending along sidewalls of the gate structure and the semiconductor fin;
etching back the semiconductor fin to form a first recess;
removing a first portion of the dielectric structure to laterally enlarge the first recess;
forming a source/drain (S/D) feature in the enlarged first recess;
after the forming of the S/D feature, removing a second portion of the dielectric structure to form a second recess;
forming a silicide layer in the second recess and on the S/D feature; and
after the forming of the silicide layer, forming an etch stop layer on the silicide layer and a dielectric layer on the etch stop layer.

2. The method of claim 1, wherein the forming of the dielectric structure comprises:
conformally depositing a first dielectric material layer over the workpiece; and
depositing a second dielectric material layer over the workpiece to fill spaces between portions of the first dielectric material layer, a composition of the first dielectric material layer is different than a composition of the second dielectric material layer.

3. The method of claim 2, wherein the first dielectric material layer comprises a portion extending along a sidewall surface of the semiconductor fin, wherein the removing of the first portion of the dielectric structure comprises performing an etching process to remove the portion of the first dielectric material layer.

4. The method of claim 3, wherein the etching process implements an etchant including hydrofluoric acid, ammonia, or a combination thereof.

5. The method of claim 2, wherein the removing of the second portion of the dielectric structure comprises performing an etching process to selectively remove the second dielectric material layer.

6. The method of claim 1, further comprising: after the forming of the etch stop layer and the dielectric layer, replacing the gate structure with a gate stack including a high-K dielectric layer.

7. The method of claim 1, further comprising:
after the forming of the etch stop layer and the dielectric layer, forming a source/drain contact extending through the etch stop layer and the dielectric layer to directly contact the silicide layer.

8. A method, comprising:
receiving a workpiece comprising a dummy gate structure engaging a semiconductor fin protruding from a substrate, the dummy gate structure extending lengthwise along a first direction;
recessing the semiconductor fin to form a source/drain recess;
enlarging the source/drain recess along the first direction;
forming a source/drain feature in the enlarged source/drain recess;
forming a silicide layer extending along a sidewall surface and a top surface of the source/drain feature;
after the forming of the silicide layer, replacing the dummy gate structure with a metal gate stack.

9. The method of claim 8, wherein the semiconductor fin comprises a vertical stack of alternating channel layers and sacrificial layers.

10. The method of claim 9, further comprising:
after the enlarging of the source/drain recess along the first direction, selectively recessing the sacrificial layers along a second direction to form inner spacer recesses, the second direction is substantially perpendicular to the first direction; and
forming inner spacer features in the inner spacer recesses.

11. The method of claim 10, wherein the replacing of the dummy gate structure with the metal gate stack comprises:
after the forming of the silicide layer, depositing a contact etch-stop layer (CESL) over the silicide layer;
forming an interlayer dielectric (ILD) layer over the CESL;
removing the dummy gate structure to from a gate trench;
removing the sacrificial layers to from openings; and
forming the metal gate stack in the gate trench and the openings to wrap around each of the channel layers.

12. The method of claim 8, wherein the workpiece further comprises a dielectric fin disposed adjacent to the semiconductor fin along the first direction, and the method further comprises:
before the recessing of the semiconductor fin to form the source/drain recess, forming a first dielectric layer over the workpiece, the first dielectric layer comprises a first portion extending along a sidewall surface of the semiconductor fin and a second portion extending along a sidewall surface of the dielectric fin; and
forming a second dielectric layer between the first and second portions of the first dielectric layer.

13. The method of claim 12, wherein the enlarging of the source/drain recess along the first direction comprises removing the first portion of the first dielectric layer.

14. The method of claim 12, further comprising:
before the forming of the silicide layer, selectively removing the second dielectric layer.

15. The method of claim 14, further comprising:
after the selectively removing of the second dielectric layer, selectively removing the second portion of the first dielectric layer.

16. A method, comprising:
forming a semiconductor fin protruding from a substrate;
forming a source/drain feature in and over a source/drain region of the semiconductor fin;
forming a silicide layer extending along a sidewall surface and a top surface of the source/drain feature;
conformally forming a contact etch stop layer, the contact etch stop layer comprises a first portion extending along a sidewall surface of the silicide layer and a second portion on a top surface of the source/drain feature; and
forming a source/drain contact extending through the second portion of the contact etch stop layer to directly contact the silicide layer.

17. The method of claim 16, further comprising:
forming a dielectric fin adjacent to the semiconductor fin;
comfortably depositing a first dielectric layer over the dielectric fin and the semiconductor fin; and
forming a second dielectric layer over the first dielectric layer, wherein the first portion of the contact etch stop layer is disposed between the silicide layer and the dielectric fin.

18. The method of claim 17, wherein a composition of the first dielectric layer is different from a composition of the second dielectric layer.

19. The method of claim 17, wherein the forming of the source/drain feature comprises:
removing the source/drain region of the semiconductor fin and a portion of the first dielectric layer that extends along the semiconductor fin to form a source/drain recess; and
performing an epitaxial growth process to form the source/drain feature in the source/drain recess.

20. The method of claim 17, further comprising:
before the forming of the silicide layer, selectively removing the second dielectric layer.

* * * * *